US008368145B2

(12) United States Patent  
Fukuoka et al.

(10) Patent No.: US 8,368,145 B2  
(45) Date of Patent: Feb. 5, 2013

(54) SEMICONDUCTOR DEVICE AND ELECTRONIC DEVICE

(75) Inventors: Osamu Fukuoka, Aichi (JP); Masahiko Hayakawa, Kanagawa (JP); Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 449 days.

(21) Appl. No.: 12/479,291

(22) Filed: Jun. 5, 2009

(65) Prior Publication Data

US 2009/0321869 A1 Dec. 31, 2009

(30) Foreign Application Priority Data

Jun. 25, 2008 (JP) .................................. 2008-165204

(51) Int. Cl.  
*H01L 33/00* (2010.01)

(52) U.S. Cl. ........ 257/355; 257/358; 257/360; 257/363; 257/653; 257/603; 257/481; 361/56; 361/111; 330/308

(58) Field of Classification Search .................. 257/355, 257/358, 360, 363, E27.051, E29.335, E29.332, 257/653, 603, 481; 361/56, 111; 330/308  
See application file for complete search history.

(56) References Cited

U.S. PATENT DOCUMENTS

| | | | |
|---|---|---|---|
| 5,157,573 A | 10/1992 | Lee et al. | |
| 5,218,222 A | 6/1993 | Roberts | |
| 5,594,266 A * | 1/1997 | Beigel et al. ................ | 257/355 |
| 5,689,133 A | 11/1997 | Li et al. | |
| 5,825,601 A | 10/1998 | Statz et al. | |
| 5,889,309 A * | 3/1999 | Yu et al. ........................ | 257/363 |
| 6,118,154 A | 9/2000 | Yamaguchi et al. | |
| 6,180,996 B1 | 1/2001 | Onoda et al. | |
| 6,261,883 B1 * | 7/2001 | Koubuchi et al. ............ | 438/197 |
| 6,310,379 B1 | 10/2001 | Andresen et al. | |
| 6,320,241 B1 | 11/2001 | Okamoto | |
| 6,320,329 B1 * | 11/2001 | Wacyk .......................... | 315/291 |
| 6,492,707 B1 | 12/2002 | Kaku et al. | |
| 6,545,321 B2 | 4/2003 | Morishita | |
| 6,590,263 B2 * | 7/2003 | Gossner ....................... | 257/355 |
| 6,822,295 B2 * | 11/2004 | Larson ......................... | 257/355 |
| 6,844,596 B2 | 1/2005 | Ohnakado | |

(Continued)

FOREIGN PATENT DOCUMENTS

| | | |
|---|---|---|
| EP | 1 619 725 A2 | 1/2006 |
| JP | 05-029636 | 2/1993 |

(Continued)

*Primary Examiner* — Michael Shingleton  
(74) *Attorney, Agent, or Firm* — Nixon Peabody LLP; Jeffrey L. Costellia

(57) ABSTRACT

A semiconductor device has a structure including the first semiconductor region 103 which is provided in the first terminal portion 100 and includes the first n-type impurity region 106, the first resistance region 107 provided at an inner periphery portion of the first n-type impurity region 106 in a plane view, and the first p-type impurity region 108 provided at an inner periphery portion of the first resistance region 107 in the plane view, and the second semiconductor region 104 which is provided in the second terminal portion 101 and includes the second p-type impurity region 109, the second resistance region 110 provided at an inner periphery portion of the second p-type impurity region 109 in the plane view, and the second n-type impurity region 111 provided at an inner periphery portion of the second resistance region 110 in the plane view.

20 Claims, 31 Drawing Sheets

U.S. PATENT DOCUMENTS

| | | | |
|---|---|---|---|
| 6,936,895 B2 * | 8/2005 | Manna et al. | 257/355 |
| 7,064,023 B2 | 6/2006 | Koyama et al. | |
| 7,064,418 B2 | 6/2006 | Li et al. | |
| 7,109,533 B2 | 9/2006 | Kodama | |
| 7,173,230 B2 * | 2/2007 | Charbon | 250/214 A |
| 7,253,391 B2 | 8/2007 | Koyama et al. | |
| 7,259,029 B2 | 8/2007 | Tseng et al. | |
| 7,327,541 B1 * | 2/2008 | Wang et al. | 361/56 |
| 7,485,930 B2 * | 2/2009 | Lee et al. | 257/355 |
| 7,492,028 B2 | 2/2009 | Nishi et al. | |
| 7,495,272 B2 | 2/2009 | Maruyama et al. | |
| 7,550,820 B2 * | 6/2009 | Chen et al. | 257/601 |
| 7,667,272 B2 | 2/2010 | Hirose | |
| 7,692,999 B2 | 4/2010 | Kato | |
| 7,772,650 B2 * | 8/2010 | Chiang et al. | 257/355 |
| 7,910,999 B2 * | 3/2011 | Lee et al. | 257/355 |
| 8,174,047 B2 | 5/2012 | Fukuoka et al. | |
| 2006/0017139 A1 | 1/2006 | Eguchi et al. | |
| 2006/0261253 A1 | 11/2006 | Arao et al. | |
| 2008/0237665 A1 | 10/2008 | Shishido | |
| 2009/0310265 A1 | 12/2009 | Fukuoka et al. | |

FOREIGN PATENT DOCUMENTS

| | | |
|---|---|---|
| JP | 2006-060191 | 3/2006 |
| JP | 2008-034503 | 2/2008 |

* cited by examiner (A)

SEMICONDUCTOR DEVICE AND ELECTRONIC DEVICE

BACKGROUND OF THE INVENTION

1. Field of the Invention

The present invention relates to semiconductor devices and electronic devices.

2. Description of the Related Art

In recent years, electronic circuits (hereinafter referred to as "functional circuits") which are formed over substrates and have specific functions have been utilized for a variety of electronic components or semiconductor devices such as electronic devices.

As functional circuits, photoelectric conversion circuits and the like can be given, for example. A number of semiconductor devices including photoelectric conversion circuits generally used for detecting an electromagnetic wave (also referred to as the "photoelectric conversion devices") are known, and for example, a semiconductor device having sensitivity to ultra-violet rays to infrared rays is collectively referred to as a "light sensor". A light sensor having sensitivity to light in a visible light region with a wavelength of 400 nm to 700 nm is particularly referred to as a visible light sensor, and a large number of visible light sensors are used for devices which require illuminance adjustment, on or off control, or the like depending on human living environment.

A semiconductor device having the aforementioned functional circuit has a problem in that elements included in the circuit are electrically damaged when excessively high voltage is supplied from the outside. For example, there is a problem in that when high voltage of about several kilovolts is supplied to the functional circuit by static electricity or the like, the breakdown due to electrostatic discharge (ESD) occurs in the functional circuit. In this specification, voltage of which the absolute value is so large that elements are damaged is referred to as an "overvoltage".

In order to solve the aforementioned problems, a semiconductor device is proposed in which an overvoltage protection circuit is provided to suppress the breakdown of elements in a functional circuit even when the overvoltage is applied to the functional circuit from the outside (e.g., Patent Document 1).

For example, in a conventional semiconductor device described in Patent Document 1, diodes are placed into the conductive state when the overvoltage is applied so that tolerance to the overvoltage in an internal circuit can be increased.

CITATION LIST

[Patent Document 1] Japanese Published Patent Application No. 2006-60191

SUMMARY OF THE INVENTION

However, a conventional semiconductor device having a structure in which an overvoltage protection circuit is provided does not have sufficient tolerance to the overvoltage; for example, when the overvoltage is applied, part of elements in the vicinity of an input portion of an internal circuit is locally damaged. Accordingly, a malfunction of the internal circuit or the like is caused. Furthermore, there is a problem in that the area of a semiconductor device increases by the area of the overvoltage protection circuit which is provided.

In view of the aforementioned problems, it is an object of one embodiment of the present invention to increase tolerance to the overvoltage without increasing an area.

One embodiment of the present invention is a semiconductor device including: a first terminal portion having a first terminal; a second terminal portion having a second terminal; a functional circuit portion having a functional circuit; a semiconductor region provided under the first terminal or the second terminal; a first electrode; a second electrode; a third electrode which is electrically connected to the first electrode and is to be the first terminal; and a fourth electrode which is electrically connected to the second electrode and is to be the second terminal. The semiconductor region is electrically connected to the first electrode and the functional circuit and includes: a first impurity region having one of n-type and p-type conductivity; a resistance region provided at an inner periphery portion of the first impurity region in a plane view; and a second impurity region having the other of n-type and p-type conductivity which is provided at an inner periphery portion of the resistance region in the plane view and is electrically connected to the second electrode and the functional circuit.

Note that another embodiment of the present invention can also have a structure in which a plurality of connection portions of the functional circuit and the first electrode is provided, a plurality of connection portions of the functional circuit and the second electrode is provided, the plurality of connection portions of the functional circuit and the first electrode has a uniform resistance value, and the plurality of connection portions of the functional circuit and the second electrode has a uniform resistance value.

Further, another embodiment of the present invention can also have a structure in which a plurality of connection portions of the first impurity region and the first electrode is provided, a plurality of connection portions of the second impurity region and the second electrode is provided, the plurality of connection portions of the first impurity region and the first electrode has a uniform resistance value, and the plurality of connection portions of the second impurity region and the second electrode has a uniform resistance value.

Furthermore, another embodiment of the present invention can also have a structure in which the resistance values of the resistance regions are higher than the resistance values of the first impurity region and the second impurity region.

Another embodiment of the present invention is a semiconductor device including: a first terminal portion having a first terminal; a second terminal portion having a second terminal; a functional circuit portion having a functional circuit; a first semiconductor region provided in the first terminal portion; a second semiconductor region provided in the second terminal portion; a third semiconductor region provided in the functional circuit portion; a first electrode; a second electrode; a third electrode; a fourth electrode; a fifth electrode; a sixth electrode in contact with the second electrode, the third electrode, and the fifth electrode; a seventh electrode in contact with the first electrode and the fourth electrode; an eighth electrode which is provided over the first semiconductor region, is in contact with the sixth electrode, and is to be the first terminal; and a ninth electrode which is provided over the second semiconductor region, is in contact with the seventh electrode, and is to be the second terminal. The first semiconductor region includes: a first n-type impurity region in contact with the first electrode; a first resistance region provided at an inner periphery portion of the first n-type impurity region in a plane view; and a first p-type impurity region which is provided at an inner periphery portion of the first resistance region in the plane view and is in contact with the second electrode. The second semiconductor region includes: a second p-type impurity region in contact with the third electrode; a second resistance region provided at an inner periphery portion of the second p-type impurity region in the plane view; and a second n-type impurity region which is provided at an inner periphery portion of the second resistance region in the plane view and is in contact with the fourth electrode. The third semiconductor region is to be a part of the functional circuit and includes a third n-type impurity region which is in contact with the first electrode and the fifth electrode.

Note that another embodiment of the present invention can also have a structure in which a plurality of connection portions of the first n-type impurity region and the first electrode is provided, a plurality of connection portions of the second n-type impurity region and the fourth electrode is provided, a plurality of connection portions of the third n-type impurity region and the first electrode is provided, and a plurality of connection portions of the third n-type impurity region and the fifth electrode is provided, the plurality of connection portions of the first n-type impurity region and the first electrode has a uniform resistance value, the plurality of connection portions of the second n-type impurity region and the fourth electrode has a uniform resistance value, the plurality of connection portions of the third n-type impurity region and the first electrode has a uniform resistance value, and the plurality of connection portions of the third n-type impurity region and the fifth electrode has a uniform resistance value.

Further, another embodiment of the present invention can also have a structure in which a plurality of connection portions of the first p-type impurity region and the second electrode is provided, a plurality of connection portions of the second p-type impurity region and the third electrode is provided, the plurality of connection portions of the first p-type impurity region and the second electrode has a uniform resistance value, and the plurality of connection portions of the second p-type impurity region and the third electrode has a uniform resistance value.

Another embodiment of the present invention is a semiconductor device including: a substrate; a first potential supply portion having a first potential supply terminal over the substrate; a second potential supply portion having a second potential supply terminal over the substrate; a photoelectric conversion circuit portion having a photoelectric conversion circuit over the substrate; a first semiconductor layer provided in the first potential supply portion; a second semiconductor layer provided in the second potential supply portion; a third semiconductor layer provided in the photoelectric conversion circuit portion; a first electrode; a second electrode; a third electrode; a fourth electrode; a fifth electrode; a sixth electrode; a seventh electrode in contact with the first electrode; a photoelectric conversion layer in contact with the seventh electrode; an eighth electrode in contact with the third electrode, the fourth electrode, and the sixth electrode; a ninth electrode in contact with the second electrode, the fifth electrode, and the photoelectric conversion layer; a tenth electrode which is provided over the first semiconductor layer, is in contact with the eighth electrode, and is to be the first potential supply terminal; and an eleventh electrode which is provided over the second semiconductor layer, is in contact with the ninth electrode, and is to be the second potential supply terminal. The first semiconductor layer includes: a first n-type impurity region in contact with the second electrode; a first resistance region provided at an inner periphery portion of the first n-type impurity region in a plane view; and a first p-type impurity region which is provided at an inner periphery portion of the first resistance region in the plane view and is in contact with the third electrode. The second semiconductor layer includes: a second p-type impurity region in contact with the fourth electrode; a second resistance region provided at an inner periphery portion of the second p-type impurity region in the plane view; and a second n-type impurity region which is provided at an inner periphery portion of the second resistance region in the plane view and is in contact with the fifth electrode. The third semiconductor layer is provided in a region where the first electrode is not provided at an upper portion and includes a third n-type impurity region in contact with the sixth electrode.

Note that another embodiment of the present invention can also have a structure in which a plurality of connection portions of the first n-type impurity region and the second electrode is provided, a plurality of connection portions of the second n-type impurity region and the fifth electrode is provided, a plurality of connection portions of the third n-type impurity region and the sixth electrode is provided, the plurality of connection portions of the first n-type impurity region and the second electrode has a uniform resistance value, the plurality of connection portions of the second n-type impurity region and the fifth electrode has a uniform resistance value, and the plurality of connection portions of the third n-type impurity region and the sixth electrode has a uniform resistance value.

Further, still another embodiment of the present invention can also have a structure in which a plurality of connection portions of the first p-type impurity region and the third electrode is provided, a plurality of connection portions of the second p-type impurity region and the fourth electrode is provided, the plurality of connection portions of the first p-type impurity region and the third electrode has a uniform resistance value, and the plurality of connection portions of the second p-type impurity region and the fourth electrode has a uniform resistance value.

Furthermore, yet another embodiment of the present invention can also have a structure in which the resistance value of the first resistance region is higher than the resistance values of the first n-type impurity region and the first p-type impurity region, and the resistance value of the second resistance region is higher than the resistance values of the second n-type impurity region and the second p-type impurity region.

A still further embodiment of the present invention is an electronic device which includes any one of the aforementioned semiconductor devices.

Note that in this specification, a transistor has a structure in which at least three terminals, that is, a gate terminal, a source terminal, and a drain terminal are included. When a field-effect transistor is given as an example, a gate electrode portion (including a region to be a gate, a conductive layer, a wiring, and the like) and part of portion which is electrically connected to the gate electrode are referred to as a "gate terminal". Moreover, a source electrode portion (including a region to be a source, a conductive layer, a wiring, and the like) and part of portion which is electrically connected to the source electrode are referred to as a "source terminal". In addition, a drain electrode portion (including a region to be a drain, a conductive layer, a wiring, and the like) and part of portion which is electrically connected to the drain electrode are referred to as a "drain terminal".

Further, because the source terminal and the drain terminal of the transistor in this specification are changed depending on the structure, the operating conditions, or the like of the transistor, it is difficult to define which is a source terminal and which is a drain terminal. Therefore, in this specification, one terminal which is arbitrarily selected from a source terminal and a drain terminal is referred to as one of the source terminal and the drain terminal, whereas the other terminal is referred to as the other of the source terminal and the drain terminal.

Note that in this specification, a diode includes two terminals, that is, an anode terminal and a cathode terminal. Thus, an anode terminal is referred to as a first terminal of a diode, whereas a cathode terminal is referred to as a second terminal of a diode.

According to one embodiment of the present invention, tolerance to the overvoltage can be increased without increasing the area.

DETAILED DESCRIPTION OF THE INVENTION

Hereinafter, embodiments of the present invention will be described with reference to the drawings. Note that the present invention is not limited to the following description, and it is easily understood by those skilled in the art that modes and details thereof can be modified in various ways without departing from the spirit and scope of the present invention. Thus, the present invention should not be interpreted as being limited to the following description of the embodiments.

Embodiment 1

In this embodiment, a structure of a semiconductor device which is one embodiment of the present invention will be described.

The semiconductor device in this embodiment is provided with a first terminal portion including a first terminal, a second terminal portion including a second terminal, and a functional circuit portion including a functional circuit.

Further, the semiconductor device in this embodiment includes a semiconductor region, a first electrode, a second electrode, a third electrode, and a fourth electrode.

In the semiconductor device in this embodiment, either a first terminal or a second terminal is provided over the semiconductor region. Further, the semiconductor region includes a first impurity region having one of n-type and p-type conductivity, a resistance region provided at an inner periphery portion of a first impurity region in a plane view, and a second impurity region having the other of n-type and p-type conductivity which is provided at an inner periphery portion of the resistance region in the plane view.

The first electrode is electrically connected to an impurity region having n-type conductivity of either the first impurity region or the second impurity region and the functional circuit.

The second electrode is electrically connected to an impurity region having p-type conductivity of either the first impurity region or the second impurity region and the functional circuit.

The third electrode is an electrode to be the first terminal and is electrically connected to the first electrode.

The fourth electrode is an electrode to be a second terminal and is electrically connected to the second electrode.

Figure 1:
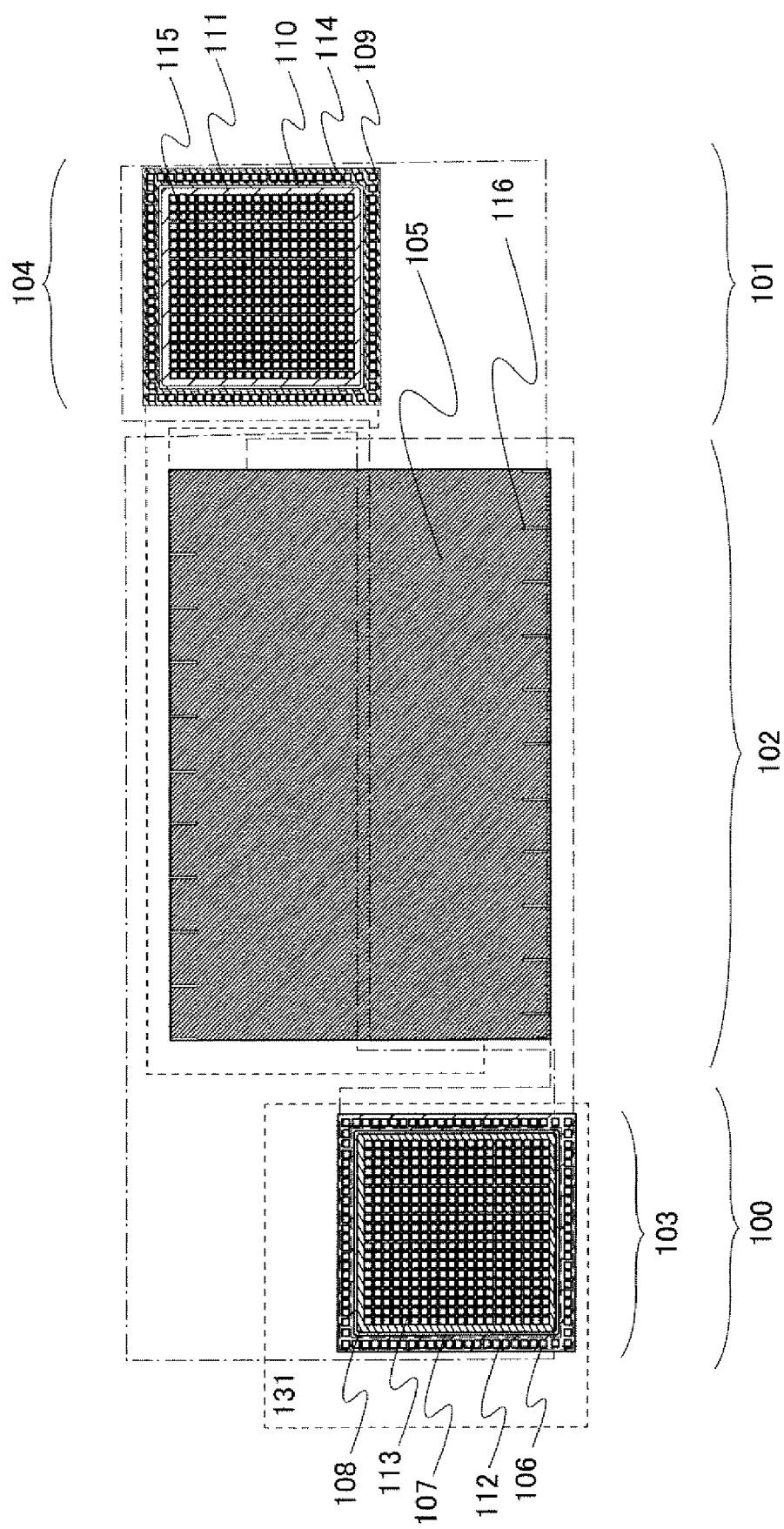
FIG. 1 is a plan schematic view illustrating a structural example of a semiconductor device in Embodiment 1.
Figure 2:
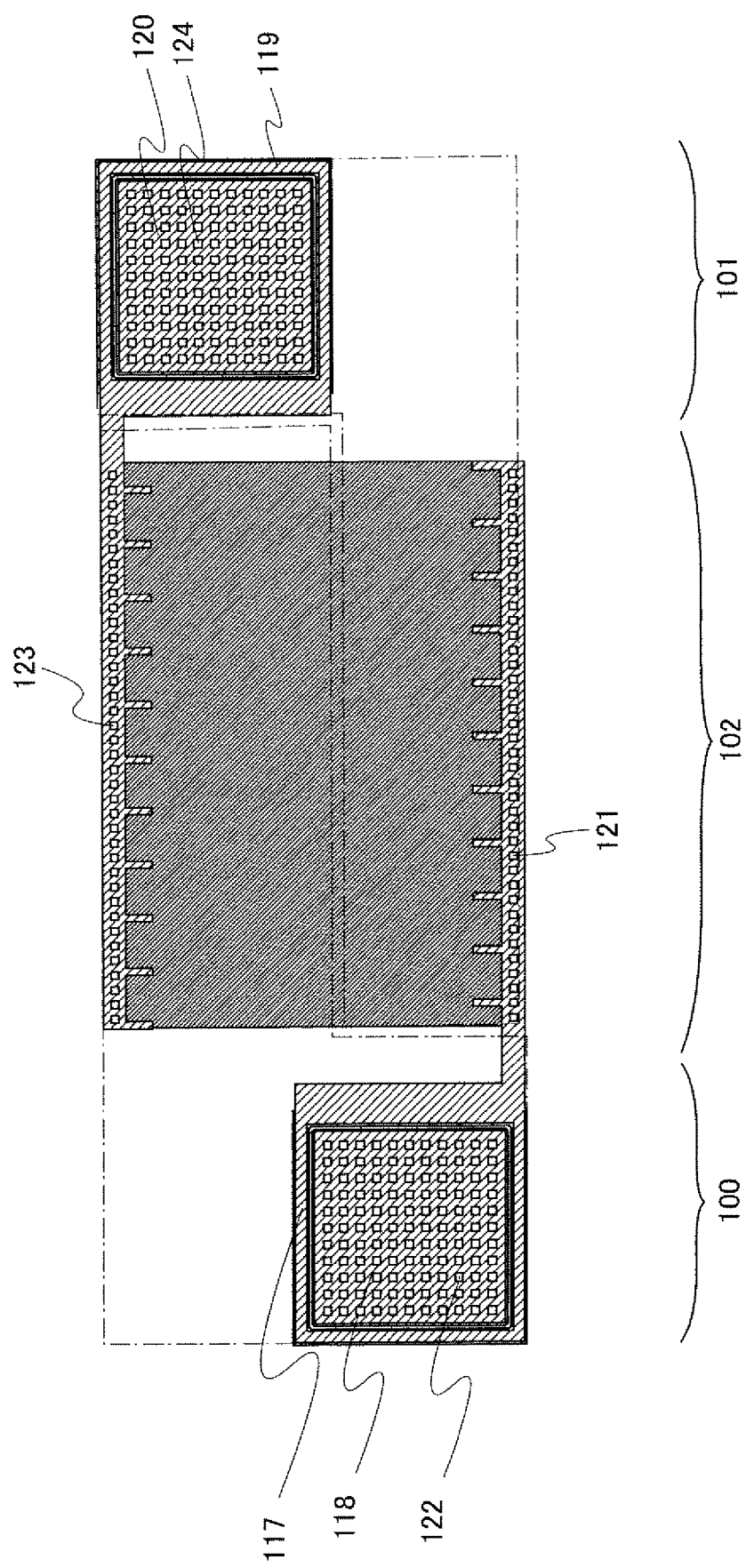
FIG. 2 is a plan schematic view illustrating a structural example of a semiconductor device in Embodiment 1.
Figure 3:
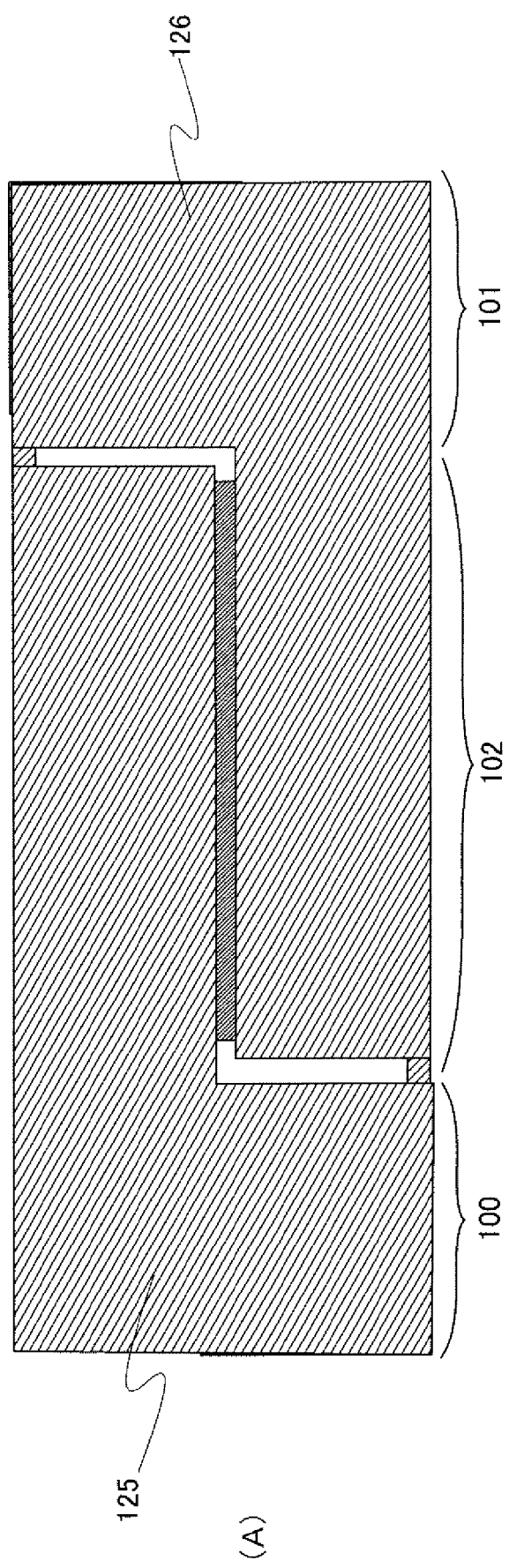
FIG. 3 is a plan schematic view illustrating a structural example of a semiconductor device in Embodiment 1.

Further, the semiconductor device in this embodiment is described with reference to FIG. 1, FIG. 2, and FIG. 3. FIG. 1, FIG. 2, and FIG. 3 are plan schematic views each illustrating a structural example of the semiconductor device in this embodiment.

Note that FIG. 1, FIG. 2, and FIG. 3 are diagrams each schematically illustrating a structure of the same semiconductor device. In FIG. 1, the second electrode and portions formed over the second electrode are omitted for convenience. Further, in FIG. 2, the third electrode is omitted for convenience. In addition, a semiconductor device illustrated in FIG. 1, FIG. 2, and FIG. 3 includes portions with different shapes and sizes from those of the actual semiconductor device for convenience.

A semiconductor device illustrated in FIG. 1, FIG. 2, and FIG. 3 includes a first terminal portion 100, a second terminal portion 101, and a functional circuit portion 102.

The first terminal portion 100 is a portion to be provided with an electrode to be a first terminal of a semiconductor device (also referred to as a "first pad portion"), the second terminal portion 101 is a portion to be provided with an electrode to be a second terminal of the semiconductor device (also referred to as a "second pad portion"), and the potential is provided to the semiconductor device through the first terminal portion 100 and the second terminal portion 101. The potential is utilized as a signal or power supply.

Further, a semiconductor device illustrated in any of FIG. 1, FIG. 2, and FIG. 3 includes a first semiconductor region 103 including a first n-type impurity region 106, a first resistance region 107, and a first p-type impurity region 108; a second semiconductor region 104 including a second p-type impurity region 109, a second resistance region 110, and a second n-type impurity region 111; a functional circuit 105 provided in the functional circuit portion 102; a first insulating film (not illustrated in FIG. 1, FIG. 2, and FIG. 3 for convenience) provided so as to cover the first semiconductor region 103, the second semiconductor region 104, and the functional circuit 105; a first electrode 117, a second electrode 118, a third electrode 119, and a fourth electrode 120 which are provided over the first insulating film; a second insulating film (not illustrated in FIG. 1, FIG. 2, and FIG. 3 for convenience) provided so as to cover the first electrode 117 through the fourth electrode 120; and a fifth electrode 125 and a sixth electrode 126 which are provided over the second insulating film.

The first semiconductor region 103 is provided in the first terminal portion 100, and the second semiconductor region 104 is provided in the second terminal portion 101.

The first n-type impurity region 106 is a region including an impurity element having n-type conductivity. Further, the first p-type impurity region 108 is a region including an impurity element having p-type conductivity.

The second p-type impurity region 109 is a region including an impurity element having p-type conductivity. Further, the second n-type impurity region 111 is a region including an impurity element having n-type conductivity.

The first resistance region 107 and the second resistance region 110 have a higher resistance value than the first n-type impurity region 106, the first p-type impurity region 108, the second p-type impurity region 109, and the second n-type impurity region 111. Note that it is acceptable as long as the first resistance region 107 and the second resistance region 110 have a higher resistance value than the first n-type impurity region 106, the first p-type impurity region 108, the second p-type impurity region 109, and the second n-type impurity region 111, and an n-type impurity element or a p-type impurity element may be added to the first resistance region 107 and the second resistance region 110.

Figure 4:
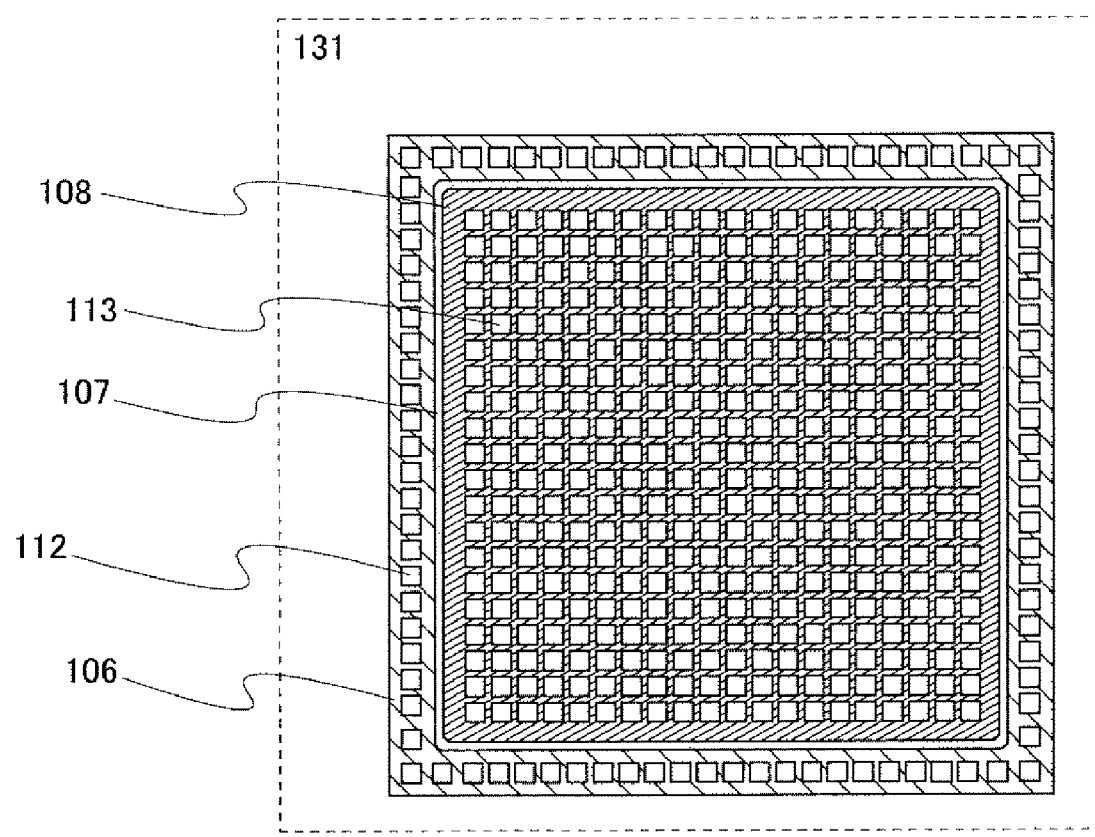
FIG. 4 is an enlarged view of a region 131 of a semiconductor device illustrated in FIG. 1.

Further, FIG. 4 is an enlarged view of the region 131 of the semiconductor device illustrated in FIG. 1. As illustrated in FIG. 1 and FIG. 4, the first resistance region 107 is provided at an inner periphery portion of the first n-type impurity region 106 in a plane view. Further, the first p-type impurity region 108 is provided at an inner periphery portion of the first resistance region 107 in the plane view.

Furthermore, the second resistance region 110 is provided at an inner periphery portion of the second p-type impurity region 109 in the plane view. Moreover, the second n-type impurity region 111 is provided at an inner periphery portion of the second resistance region 110 in the plane view, and a resistance region is provided between a p-type impurity region and an n-type impurity region in the plane view.

In addition, it is preferable that the first n-type impurity region 106, the first resistance region 107, the first p-type impurity region 108, the second p-type impurity region 109, the second resistance region 110, and the second n-type impurity region 111 be each designed to have such a shape or the like that the potential is uniformly provided to each of entire regions when the overvoltage is applied. The regions are each designed to have such a shape that the potential is uniformly provided to each of the entire regions, whereby the local concentration of an electric field in each of the regions can be suppressed. For example, in FIG. 1, FIG. 2, FIG. 3, and FIG. 4, each of the regions has a quadrangular shape in a plane view.

Moreover, in a semiconductor device illustrated in FIG. 1, FIG. 2, FIG. 3, and FIG. 4, an example is described in which semiconductor regions are provided in all terminal portions. Semiconductor regions are provided in all terminal portions, whereby tolerance to the overvoltage can be increased. However, the present invention is not limited thereto, and the semiconductor device in this embodiment may have a structure in which semiconductor regions are provided only in any of terminal portions.

Further, a semiconductor device illustrated in FIG. 1, FIG. 2, FIG. 3, and FIG. 4 has a structure in which the first resistance region 107 is provided at an inner periphery portion of the first n-type impurity region 106 and the first p-type impurity region 108 is provided at an inner periphery portion of the first resistance region 107. The structure is employed, whereby the local concentration of an electric field in certain portions can be suppressed in the case where the potential is supplied from a potential supply terminal.

Furthermore, a semiconductor device illustrated in FIG. 1, FIG. 2, FIG. 3, and FIG. 4 has a structure in which the second resistance region 110 is provided at an inner periphery portion of the second p-type impurity region and the second n-type impurity region 111 is provided at an inner periphery portion of the second resistance region 110. The structure is employed, whereby the local concentration of an electric field in certain portions can be suppressed in the case where the potential is supplied from a potential supply terminal.

Figure 5:
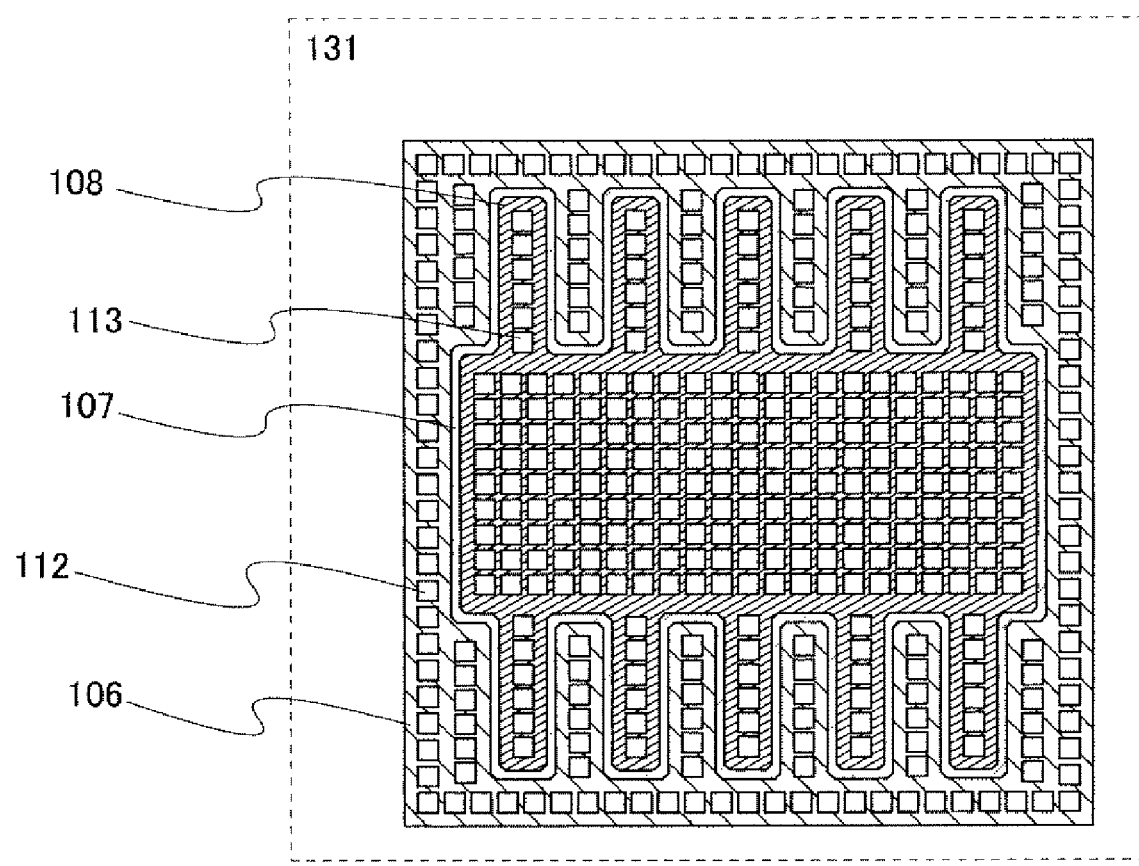
FIG. 5 is a diagram illustrating a structural example of a semiconductor region of a semiconductor device in Embodiment 1.

In addition, it is preferable that in the semiconductor device in this embodiment, a distance between the first n-type impurity region 106 and the first p-type impurity region 108 or a distance between the second p-type impurity region 109 and the second n-type impurity region 111 be denoted by L and a perimeter of the first resistance region 107 or the second resistance region 110 be denoted by W. In this case, it is preferable that L be shorter and W be longer than a certain length. By shortening L, the resistance value between the first n-type impurity region 106 and the first p-type impurity region 108 and the resistance value between the second p-type impurity region 109 and the second n-type impurity region 111 can be reduced to a value enough to perform a desired overvoltage protection operation. Further, when W is longer than a certain length, tolerance to the overvoltage can be increased. Moreover, when L is shorter than a certain length, the leakage current is increased; accordingly, L is preferably designed within a range of a length at which the leakage current is not increased. For example, in FIG. 1, FIG. 2, FIG. 3, and FIG. 4, each of the regions has a quadrangular shape in a plane view; however, the semiconductor device in this embodiment can also have a polygonal shape as illustrated in FIG. 5. Furthermore, although not illustrated, the semiconductor device in this embodiment can also have various shapes such as a circular shape.

The functional circuit 105 is a circuit which has a certain function and includes a first input terminal and a second input terminal. The functional circuit 105 is formed using, for example, a transistor. Further, as the functional circuit 105, another terminal can be provided in addition to the first input terminal and the second input terminal.

The first insulating film includes a first opening portion 112, a second opening portion 113, a third opening portion 114, a fourth opening portion 115, and a fifth opening portion 116 which are selectively provided.

The first electrode 117 is in contact with the first n-type impurity region 106 through the first opening portion 112 and is also contact with the functional circuit 105 through the fifth opening portion 116.

Further, the second electrode 118 is in contact with the first p-type impurity region 108 through the second opening portion 113.

Furthermore, the third electrode 119 is in contact with the second p-type impurity region 109 through the third opening portion 114 and is also contact with the functional circuit 105 through the fifth opening portion 116.

In addition, the fourth electrode 120 is in contact with the second n-type impurity region 111 through the fourth opening portion 115.

Note that it is preferable that in order that the overvoltage is not locally applied in the functional circuit, a plurality of portions at which the first electrode 117 is in contact with the functional circuit 105 (also referred to as a "connection portion of the first electrode 117 and the functional circuit 105") be provided, a plurality of portions at which the third electrode 119 is in contact with the functional circuit 105 (also referred to as a "connection portion of the third electrode 119 and the functional circuit 105") be provided, and the plurality of connection portions of the first electrode 117 and the functional circuit 105 be designed to have such a shape or the like that the potential supply to the functional circuit is uniform, that is, the resistance values are uniform. It is also preferable that the plurality of connection portions of the third electrode 119 and the functional circuit 105 be designed to have such a shape or the like that the potential supply to the functional circuit is uniform, that is, the resistance values are uniform. As an example, the semiconductor device illustrated in FIG. 1, FIG. 2, FIG. 3, and FIG. 4 has a structure in which the connection portion of the first electrode 117 and the functional circuit 105 and the connection portion of the third electrode 119 and the functional circuit 105 each have a comb shape and combs are provided at predetermined intervals so that the potential supply from each of the combs to the functional circuit 105 is uniform, that is, the resistance values of each of the connection portions are uniform.

The second insulating film includes a sixth opening portion 121, a seventh opening portion 122, an eighth opening portion 123, and a ninth opening portion 124 which are selectively provided.

The fifth electrode 125 is in contact with the second electrode 118 through the seventh opening portion 122 and is also contact with the third electrode 119 through the eighth opening portion 123.

Further, the sixth electrode 126 is in contact with the first electrode 117 through the sixth opening portion 121 and is also contact with the fourth electrode 120 through the ninth opening portion 124.

Figure 6:
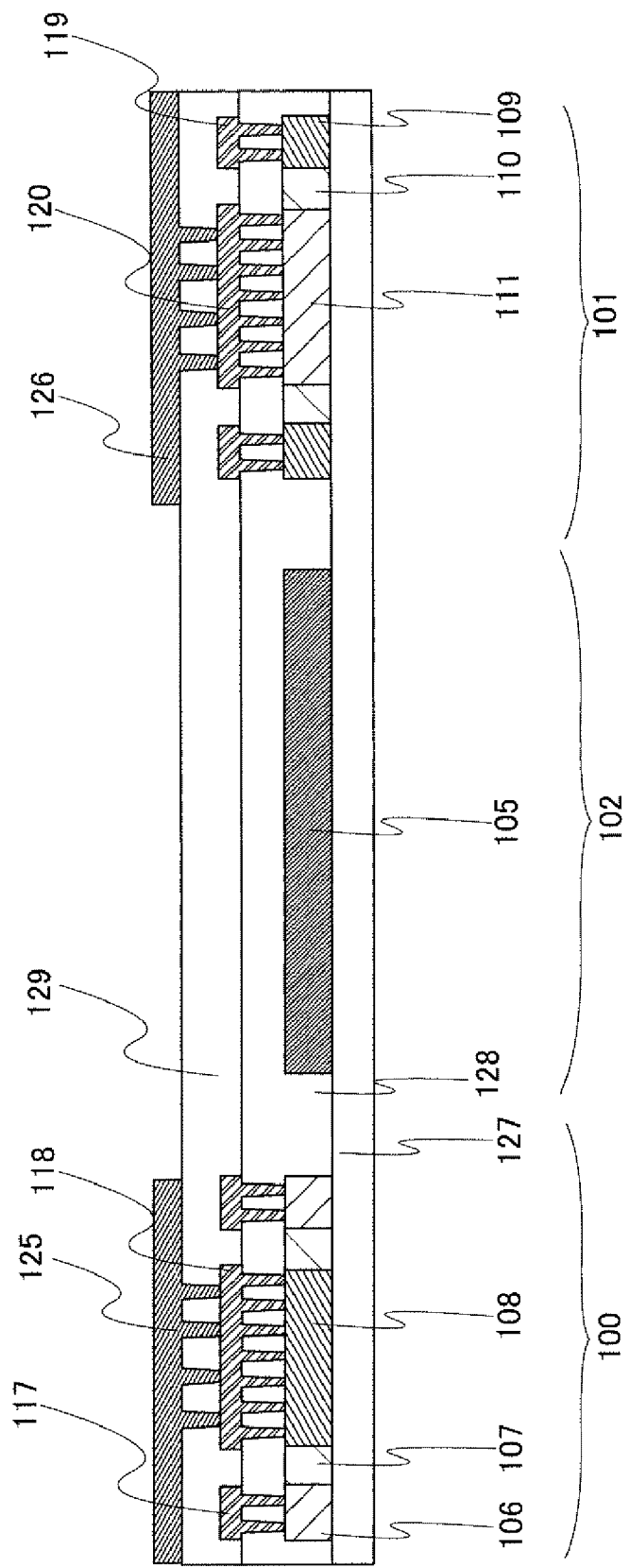
FIG. 6 is a cross-sectional schematic view illustrating an example of a cross-sectional structure of a semiconductor device illustrated in FIG. 1, FIG. 2, and FIG. 3.

Next, a cross-sectional structure of the semiconductor device in this embodiment is described with reference to FIG. 6. FIG. 6 is a cross-sectional schematic view illustrating an example of a cross-sectional structure of a semiconductor device illustrated in FIG. 1, FIG. 2, and FIG. 3. Note that a semiconductor device having a structure in which a semiconductor layer is provided over a substrate is described here as an example.

As in FIG. 1, FIG. 2, and FIG. 3, a semiconductor device illustrated in FIG. 6 includes the first terminal portion 100, the second terminal portion 101, and the functional circuit portion 102. More specifically, the semiconductor device illustrated in FIG. 6 includes a substrate 127; a first semiconductor layer which includes the first n-type impurity region 106, the first resistance region 107, and the first p-type impurity region 108 and which is provided over the substrate 127 (which corresponds to the first semiconductor region 103 in FIG. 1); a second semiconductor layer which includes the second p-type impurity region 109, the second resistance region 110, and the second n-type impurity region 111 (which corresponds to the second semiconductor region 104 in FIG. 1); the functional circuit 105; a first insulating film 128 which is provided so as to cover the first semiconductor layer, the second semiconductor layer, and the functional circuit 105; the first electrode 117, the second electrode 118, the third electrode 119, and the fourth electrode 120 which are selectively provided over the first insulating film 128; a second insulating film 129 which is provided so as to cover the first electrode 117 through the fourth electrode 120; and the fifth electrode 125 and the sixth electrode 126 which are provided over the second insulating film 129.

As the substrate 127, a glass substrate, a quartz substrate, or the like can be used, for example. Further, if a base insulating film is provided over a substrate, a silicon substrate, a metal substrate, a stainless steel substrate, or the like can also be used. Furthermore, in addition to the aforementioned substrates, a flexible substrate can also be used. A flexible substrate is a substrate which can be bent (is flexible). For example, a plastic substrate and the like formed using polycarbonate, polyarylate, polyethersulfone, or the like can be given as examples of a flexible substrate. Alternatively, as the substrate 127, for example, an attachment film (formed using polypropylene, polyester, vinyl, polyvinyl fluoride, polyvinyl chloride, or the like), paper of a fibrous material, a base material film (polyester, polyamide, an inorganic vapor deposition film, paper, or the like), or the like can be used.

Further, the first semiconductor layer and the second semiconductor layer can be formed using, for example, an amorphous semiconductor film, a single crystalline semiconductor film, a polycrystalline semiconductor film, a microcrystalline (also referred to as "semi-amorphous") semiconductor film, or the like. Alternatively, the first semiconductor layer and the second semiconductor layer can also be formed by stacking these semiconductor films. Furthermore, a semiconductor film can be formed by, for example, a sputtering method, an LPCVD method, a plasma CVD method, or the like. Alternatively, a semiconductor film having a crystalline structure (a crystalline semiconductor film) which is formed by crystallizing an amorphous semiconductor film by a known technique (such as a solid-phase growth method, a laser crystallization method, or a crystallization method using a catalytic metal) can be used. For example, a polycrystalline silicon film can also be used.

As the first insulating film 128, an insulating nitride film, an insulating oxide film, an insulating oxide film containing nitrogen, or the like can be used, for example. Further, in the first insulating film 128, a first opening portion (the first opening portion 112 in FIG. 1), a second opening portion (the second opening portion 113 in FIG. 1), a third opening portion (the third opening portion 114 in FIG. 1), a fourth opening portion (the fourth opening portion 115 in FIG. 1), and a fifth opening portion (the fifth opening portion 116 in FIG. 1) are provided.

The first electrode 117 through the fourth electrode 120 can also be formed in a single layer or a stacked layer using an element selected from, for example, gold; silver; platinum; nickel; silicon; tungsten; chromium; molybdenum; iron; cobalt; copper; palladium; carbon; aluminum; manganese; titanium; tantalum; or the like or a material formed of an alloy which includes a plurality of the elements. As an alloy which includes a plurality of the aforementioned elements, an alloy including aluminum and titanium, an alloy including aluminum, titanium, and carbon, an alloy including aluminum and nickel, an alloy including aluminum and carbon, an alloy including aluminum, nickel, and carbon, or an alloy including aluminum and molybdenum can be employed, for example. Further, a light-transmitting material such as indium tin oxide (ITO), indium tin oxide containing silicon oxide (ITSO), or indium zinc oxide (IZO) can be used. Furthermore, the first electrode 117 through the fourth electrode 120 can also be formed using different materials. In addition, the first electrode 117 through the fourth electrode 120 can be formed using an evaporation method, a sputtering method, a CVD method, a printing method, or a droplet discharge method, for example.

As the second insulating film 129, an insulating nitride film, an insulating oxide film, an insulating oxide film containing nitrogen, or the like can be used, for example. In the second insulating film 129 of a semiconductor device illustrated in FIG. 7, a sixth opening portion (the sixth opening portion 121 in FIG. 2), a seventh opening portion (the seventh opening portion 122 in FIG. 2), an eighth opening portion (the eighth opening portion 123 in FIG. 2), and a ninth opening portion (the ninth opening portion 124 in FIG. 2) are provided.

The fifth electrode 125 and the sixth electrode 126 can be formed in a single layer or a stacked layer using an element selected from, for example, gold, silver, platinum, nickel, silicon, tungsten, chromium, molybdenum, iron, cobalt, copper, palladium, carbon, aluminum, manganese, titanium, tantalum, or the like, or a material formed of an alloy which includes a plurality of the elements. As an alloy which includes a plurality of the aforementioned elements, an alloy including aluminum and titanium, an alloy including aluminum, titanium, and carbon, an alloy including aluminum and nickel, an alloy including aluminum and carbon, an alloy including aluminum, nickel, and carbon, or an alloy including aluminum and molybdenum can be employed, for example. Further, a light-transmitting material such as indium tin oxide (ITO), indium tin oxide containing silicon oxide (ITSO), or indium zinc oxide (IZO) can be used. Furthermore, the fifth electrode 125 and the sixth electrode 126 can be formed using different materials. In addition, the fifth electrode 125 and the sixth electrode 126 can be formed using an evaporation method, a sputtering method, a CVD method, a printing method, or a droplet discharge method, for example.

Figure 7:
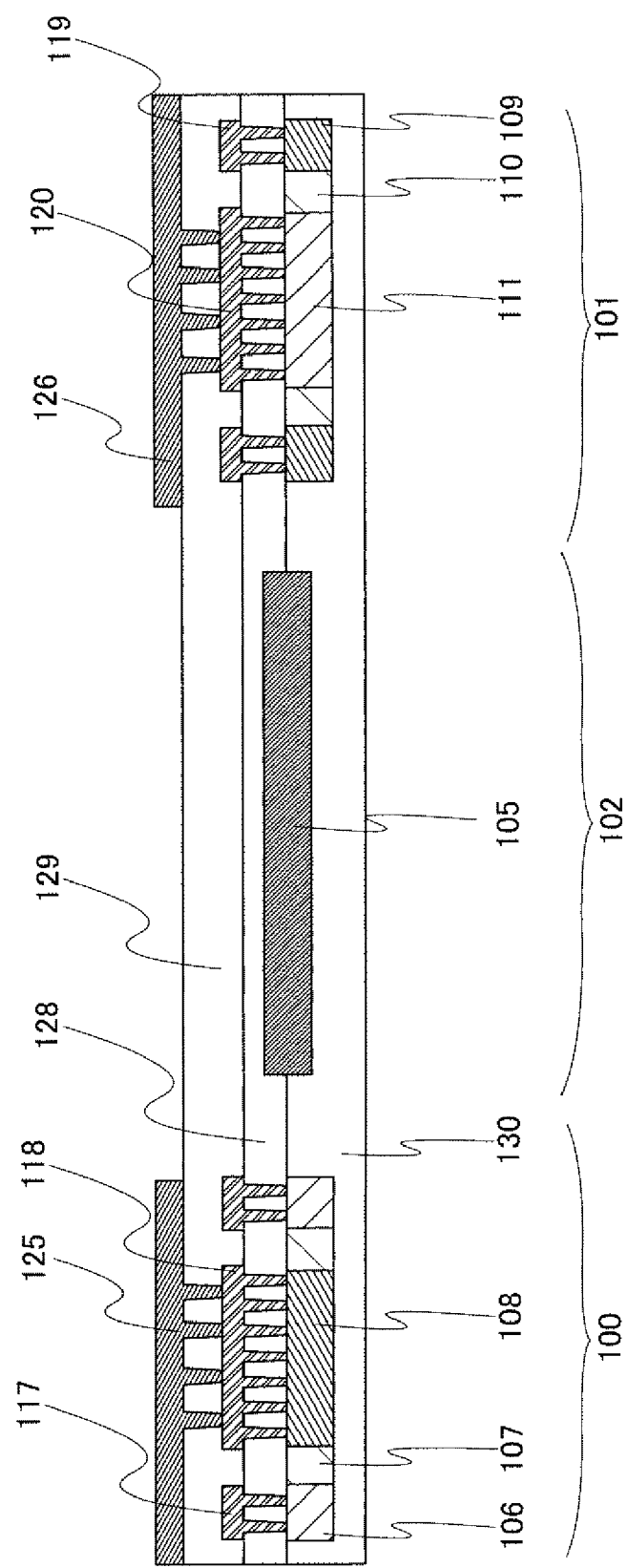
FIG. 7 is a cross-sectional schematic view illustrating an example of a cross-sectional structure of a semiconductor device illustrated in FIG. 1, FIG. 2, and FIG. 3.

Moreover, the structure of the semiconductor device in this embodiment is not limited to a structure illustrated in FIG. 6, and the semiconductor device in this embodiment can also have a structure in which a semiconductor substrate is used and an impurity region is provided over part of the semiconductor substrate. A structure of a semiconductor device in which a semiconductor substrate is used and an impurity region is provided over part of the semiconductor substrate is described with reference to FIG. 7. FIG. 7 is a cross-sectional schematic view illustrating a cross-sectional structure of a semiconductor device illustrated in FIG. 1, FIG. 2, and FIG. 3.

As in FIG. 1, FIG. 2, and FIG. 3, a semiconductor device illustrated in FIG. 7 includes the first terminal portion 100, the second terminal portion 101, and the functional circuit portion 102. More specifically, a semiconductor device illustrated in FIG. 7 includes a semiconductor substrate 130; a first semiconductor region which includes the first n-type impurity region 106, the first resistance region 107, and the first p-type impurity region 108 and which is provided over part of the semiconductor substrate 130 (the first semiconductor region 103 in FIG. 1); a second semiconductor region which includes the second p-type impurity region 109, the second resistance region 110, and the second n-type impurity region 111 (the second semiconductor region 104 in FIG. 1); a functional circuit 105; a first insulating film 128 which is provided so as to cover the first semiconductor region, the second semiconductor region, and the functional circuit 105; the first electrode 117, the second electrode 118, the third electrode 119, and the fourth electrode 120 which are selectively provided over the first insulating film 128; a second insulating film 129 which is provided so as to cover the first electrode 117 through the fourth electrode 120; and the fifth electrode 125 and the sixth electrode 126 which are provided over the second insulating film 129.

As the semiconductor substrate 130, for example, an n-type or p-type single crystalline silicon substrate, a compound semiconductor substrate (a GaAs substrate, an InP substrate, a CaN substrate, a SiC substrate, a sapphire substrate, a ZnSe substrate, or the like), a silicon on insulator (SOI) substrate manufactured by a bonding method or a separation by implanted oxygen (SIMOX) method, or the like can also be used.

Further, in the first insulating film 128 of the semiconductor device illustrated in FIG. 7, a first opening portion (the first opening portion 112 in FIG. 1), a second opening portion (the second opening portion 113 in FIG. 1), a third opening portion (the third opening portion 114 in FIG. 1), a fourth opening portion (the fourth opening portion 115 in FIG. 1), and a fifth opening portion (the fifth opening portion 116 in FIG. 1) are provided.

In the second insulating film 129, a sixth opening portion (the sixth opening portion 121 in FIG. 2), a seventh opening portion (the seventh opening portion 122 in FIG. 2), an eighth opening portion (the eighth opening portion 123 in FIG. 2), and a ninth opening portion (the ninth opening portion 124 in FIG. 2) are provided.

In addition, although not illustrated for convenience, the fifth electrode is electrically connected to an electrode to be a first terminal, and the sixth electrode is electrically connected to an electrode to be a second terminal.

Figure 8:
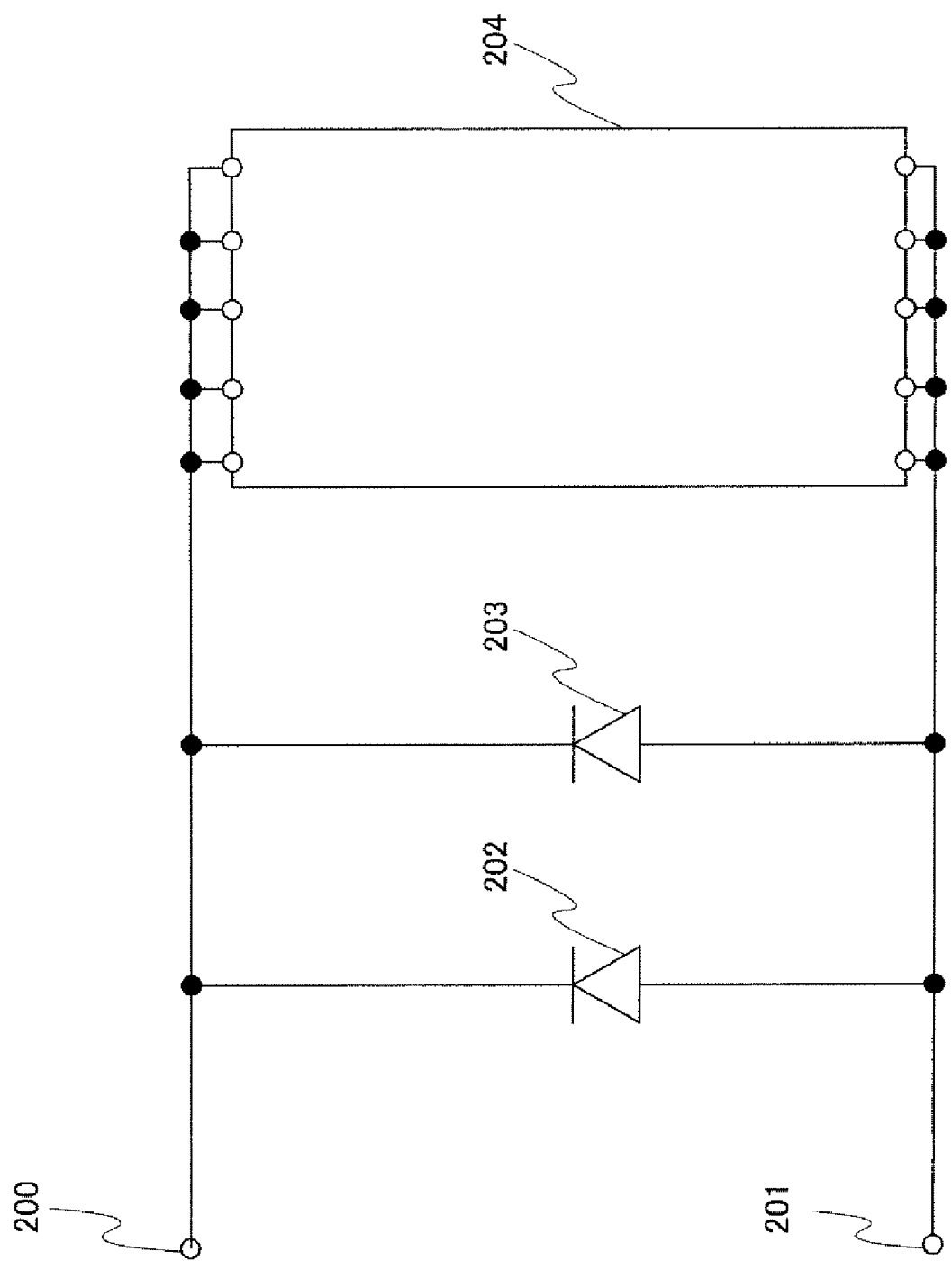
FIG. 8 is an equivalent circuit diagram illustrating an equivalent circuit of a semiconductor device illustrated in FIG. 1, FIG. 2, and FIG. 3.

Next, an equivalent circuit of the semiconductor device in this embodiment is described with reference to FIG. 5. FIG. 8 is an equivalent circuit diagram illustrating an equivalent circuit of a semiconductor device illustrated in FIG. 1. FIG. 2, and FIG. 3.

As illustrated in FIG. 8, an equivalent circuit of a semiconductor device illustrated in FIG. 1, FIG. 2, and FIG. 3 has a structure in which a terminal 200, a terminal 201, a first diode 202, a second diode 203, and a functional circuit 204 are included.

A first terminal of the first diode 202 is electrically connected to the terminal 201, and a second terminal is electrically connected to the terminal 200.

A first terminal of the second diode 203 is electrically connected to the terminal 201, and a second terminal is electrically connected to the terminal 200.

The functional circuit 204 includes a plurality of first terminals and a plurality of second terminals. The plurality of first terminals is electrically connected to the terminal 200 and the plurality of second terminals is electrically connected to the terminal 201. Note that in FIG. 8, six of the plurality of first terminals and six of the plurality of second terminals are illustrated; however, the number of the first terminals and the second terminals is not limited to six. In the semiconductor device in this embodiment, a plurality of terminal portions in a functional circuit is provided and resistance in each of the terminal portions is made uniform, whereby the local breakdown of part of a potential supply portion in the functional circuit can be suppressed when the overvoltage is applied. Accordingly, tolerance of the semiconductor device to the overvoltage in this embodiment can be increased.

As illustrated in FIG. 8, it can be considered that the semiconductor device illustrated in FIG. 1, FIG. 2, and FIG. 3 has a structure in which two diodes are provided between a connection portion of the terminal 200 and the first terminal of the functional circuit 204 and a connection portion of the terminal 201 and the second terminal of the functional circuit 204.

Next, an operation of the semiconductor device illustrated in FIG. 1, FIG. 2, and FIG. 3 is described with reference to FIG. 8.

First, the operation of the semiconductor device in the normal condition is described.

In the normal condition, a voltage (also referred to as a "first voltage") is applied between the terminal 200 and the terminal 201.

In this case, the first diode 202 and the second diode 203 are placed into the non-conductive state, and the first voltage is applied between the plurality of first terminals of the functional circuit 204 and the plurality of second terminals of the functional circuit 204.

In the functional circuit 204, the first voltage is applied to perform a predetermined operation. The above is the operation in the normal condition.

Next, the operation of the semiconductor device when the overvoltage is applied is described.

In the case where a voltage to be the overvoltage (also referred to as a "second voltage") is applied between the terminal 200 and the terminal 201, the first diode 202 and the second diode 203 are placed into the conductive state. In this case, the second voltage is not applied to the functional circuit. Thus, the functional circuit is not damaged. The above is the operation when the overvoltage is applied.

As described above, in the semiconductor device in this embodiment, when the overvoltage is applied, a protective element including the first diode and the second diode is placed into the conductive state, whereby the overvoltage can be prevented from being applied to the functional circuit without changing the value. Accordingly, tolerance to the overvoltage can be increased.

Further, in the semiconductor device in this embodiment, plural layers of electrodes are provided, and a terminal portion is electrically connected to a functional circuit portion through the plural layers of electrodes, whereby breakdown of part of an input portion in a functional circuit can be suppressed as compared to the case where a terminal portion is electrically connected to the functional circuit portion through a single layer of electrode. Accordingly, tolerance to the overvoltage can be increased.

Furthermore, in the semiconductor device in this embodiment an overvoltage protection circuit is provided at a terminal portion, whereby increase in the circuit area of the semiconductor device can be suppressed.

Embodiment 2

In this embodiment, a semiconductor device including a photoelectric conversion circuit will be described as an example of a semiconductor device which is one embodiment of the present invention.

First, a method for manufacturing the semiconductor device in this embodiment is described with reference to FIG. 9, FIG. 10, FIG. 11, FIG. 12, FIG. 13, FIG. 14, FIG. 15, FIG. 16, FIG. 17, FIG. 18, FIG. 19, and FIG. 20. FIG. 9, FIG. 10, FIG. 11, FIG. 12, FIG. 13, FIG. 14, FIG. 15, FIG. 16, FIG. 17, FIG. 18, FIG. 19, and FIG. 20 each show a plan schematic view illustrating an example of a method for manufacturing the semiconductor device in this embodiment. Note that in this embodiment, an example of a semiconductor device having a photoelectric conversion circuit portion including a first potential supply portion, a second potential supply portion, an amplifier circuit, and a photoelectric conversion element is described.

Figure 9:
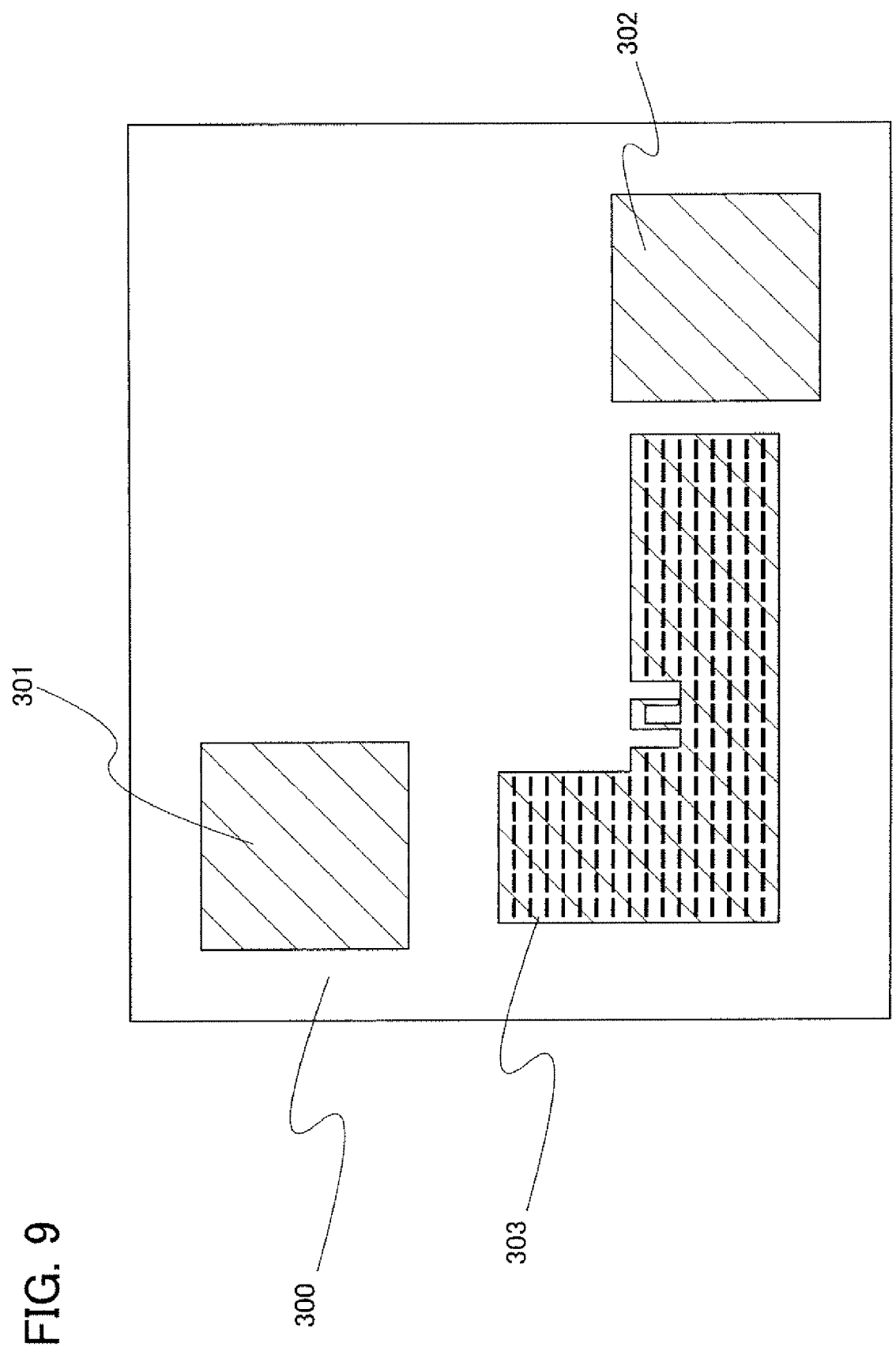
FIG. 9 is a plan schematic view illustrating an example of a method for manufacturing a semiconductor device in Embodiment 2.

First, as illustrated in FIG. 9, a first semiconductor layer 301, a second semiconductor layer 302, and a third semiconductor layer 303 are formed over a substrate 300.

As the substrate 300, a substrate similar to a substrate which can be applied to the substrate 127 illustrated in FIG. 6 can be employed, for example. In this embodiment, as an example, a glass substrate (AN100) with a thickness of 0.5 mm is used.

For the first semiconductor layer 301 through the third semiconductor layer 303, for example, a semiconductor material which can be applied to the first semiconductor layer and the second semiconductor layer in Embodiment 1 can be employed. In this embodiment, as an example, the first semiconductor layer 301 through the third semiconductor layer 303 are formed by crystallizing an amorphous semiconductor film to form a polycrystalline semiconductor layer. A method for manufacturing a polycrystalline semiconductor layer is described below. In this embodiment, as an example, the case where a polycrystalline semiconductor layer is formed by a crystallization method using a catalytic element is described.

First, an amorphous silicon film including hydrogen is formed to a thickness of 66 nm without being exposed to the atmosphere, and then a nickel acetate solution containing nickel of 10 ppm by weight is added to the formed amorphous semiconductor film by a spinner. Note that a method may be used in which a nickel element is dispersed over an entire surface by a sputtering method instead of a method in which the solution is added. Moreover, a polycrystalline silicon film is formed by heat treatment for crystallization (at 550° C. for four hours) after heat treatment (at 500° C. for one hour).

Next, an oxide film over a surface of the polycrystalline silicon film is removed with a diluted hydrofluoric acid or the like. After that, irradiation with laser light (XeCl laser beam having a wavelength of 308 nm) for increasing the crystallization rate and repairing defects left in crystal grains is performed in the atmosphere or an oxygen atmosphere.

As the laser beam, an excimer laser beam with a wavelength of 400 nm or less; or a second harmonic or a third harmonic of a YAG laser is used. Here, the surface of the silicon film may be scanned as follows: a pulsed laser beam with a repetition rate of about 10 Hz to 1000 Hz is used, the pulsed laser beam is condensed to 100 mJ/cm$^2$ to 500 mJ/cm$^2$ by an optical system, and irradiation is performed with an overlap rate of 90% to 95%. In this embodiment, irradiation with a laser beam with a repetition rate of 30 Hz and energy density of 470 mJ/cm$^2$ is performed in the atmosphere. Note that since laser beam irradiation is performed in the atmosphere or in an oxygen atmosphere, an oxide film is formed over the surface by the laser light irradiation.

Note that although an example in which the pulsed laser beam is used is described in this embodiment, a continuous wave laser beam (also referred to as a "CW laser beam") or a pulsed laser beam with a repetition rate of 10 MHz or more may be used. The CW laser beam or the pulsed laser beam with a repetition rate of 10 Hz or more is processed into a linear beam spot and the semiconductor film is irradiated with the CW laser beam or the pulsed laser beam with a repetition rate of 10 MHz or more while the semiconductor film is scanned relatively to the semiconductor film, whereby a crystal with a grain diameter which is larger than that of a crystal formed by irradiation with an excimer laser beam can be formed.

In the case of using a continuous wave laser, a laser beam which is emitted from a continuous wave YVO$_4$ laser of which output is 10 W is converted into a harmonic by a non-linear optical element. Alternatively, there is a method in which YVO$_4$ crystal and a non-linear optical element are put in a resonator and a harmonic is emitted. Then, the laser beam having a rectangular shape or an elliptical shape on an irradiated surface is preferably formed by an optical system to be emitted to an object to be processed. At this time, a power density of about 0.01 MW/cm$^2$ to 100 MW/cm$^2$ (preferably, 0.1 MW/cm$^2$ to 10 MW/cm$^2$) is necessary. Then, the semiconductor film may be moved at a rate of about 11 cm/s to 2000 cm/s relatively to the laser beam so as to be irradiated.

Subsequently, in addition to the oxide film which is formed by the aforementioned laser beam irradiation, a barrier layer formed of an oxide film having a thickness of 1 nm to 5 nm in total is formed by treatment of the surface with ozone water for about 120 seconds. This barrier layer is formed in order to remove the catalytic element which is added for crystallization, for example, nickel (Ni), from the film. Although the barrier layer is formed using ozone water here, the barrier layer may be formed by depositing an oxide film having a thickness of about 1 nm to 10 nm by a method of oxidizing a surface of the semiconductor film having a crystalline structure by ultraviolet irradiation in an oxygen atmosphere; a method of oxidizing a surface of the semiconductor film having a crystalline structure by oxygen plasma treatment; a plasma CVD method; a sputtering method; an evaporation method; or the like. In addition, the oxide film formed by the laser beam irradiation may be removed before formation of the barrier layer.

Then, an amorphous silicon film including an argon element, which serves as a gettering site, is formed to a thickness of 10 nm to 400 nm, here 100 nm, over the barrier layer by a sputtering method. Here, the amorphous silicon film including an argon element is formed under an atmosphere including argon with the use of a silicon target. In the case where the amorphous silicon film including an argon element is formed by a plasma CVD method, deposition conditions are as follows: a flow ratio of monosilane to argon (SiH$_4$:Ar) is 1:99, deposition pressure is set to 6.665 Pa, RF power density is set to 0.087 W/cm$^2$, and deposition temperature is set to 350° C.

After that, heat treatment in a furnace heated at 650° C. is performed to remove the catalytic element (gettering). Accordingly, the concentration of the catalytic element in the semiconductor film having a crystalline structure is reduced. A lamp annealing apparatus may be used instead of the furnace.

Next, the amorphous silicon film including an argon element, which is a gettering site, is selectively removed using the barrier layer as an etching stopper, and subsequently, the barrier layer is selectively removed with a diluted hydrofluoric acid. Note that nickel is likely to move to a region having high oxygen concentration at the time of gettering; therefore, it is preferable that the barrier layer formed of an oxide film be removed after gettering.

Note that in the case where crystallization of the semiconductor film with the use of the catalytic element is not performed, the aforementioned steps such as the step of forming the barrier layer, the step of forming the gettering site, the step of performing heat treatment for gettering, the step of removing the gettering site, and the step of removing the barrier layer are not necessary.

In addition, a method for forming the first semiconductor layer 301 through the third semiconductor layer 303 which are illustrated in FIG. 9 is not limited to the aforementioned manufacturing method, and another manufacturing method may be used for forming the first semiconductor layer 301 through the third semiconductor layer 303.

Through the aforementioned steps, a polycrystalline semiconductor layer can be formed. Note that the first semiconductor layer 301 is to be part of the first potential supply portion, the second semiconductor layer 302 is to be part of the second potential supply portion, and the third semiconductor layer 303 is to be part of the functional circuit.

Next, although not illustrated in FIG. 9 for convenience, a first insulating film is formed over the first semiconductor layer 301 through the third semiconductor layer 303.

As the first insulating film, an insulating nitride film, an insulating oxide film, an insulating oxide film containing nitrogen, or the like can be used, for example. In this embodiment, as an example, a silicon oxynitride film is formed to a thickness of 30 nm, whereby the first insulating film is formed.

Then, although not illustrated in FIG. 9 for convenience, as a step for adding the first impurity element, a p-type impurity element is added to the first semiconductor layer 301 through the third semiconductor layer 303 through the first insulating film. In this embodiment, as an example, boron is added at a doping concentration ranging from $2.0 \times 10^{17}$ cm$^{-3}$ to $4.0 \times 10^{17}$ cm$^{-3}$.

Figure 10:
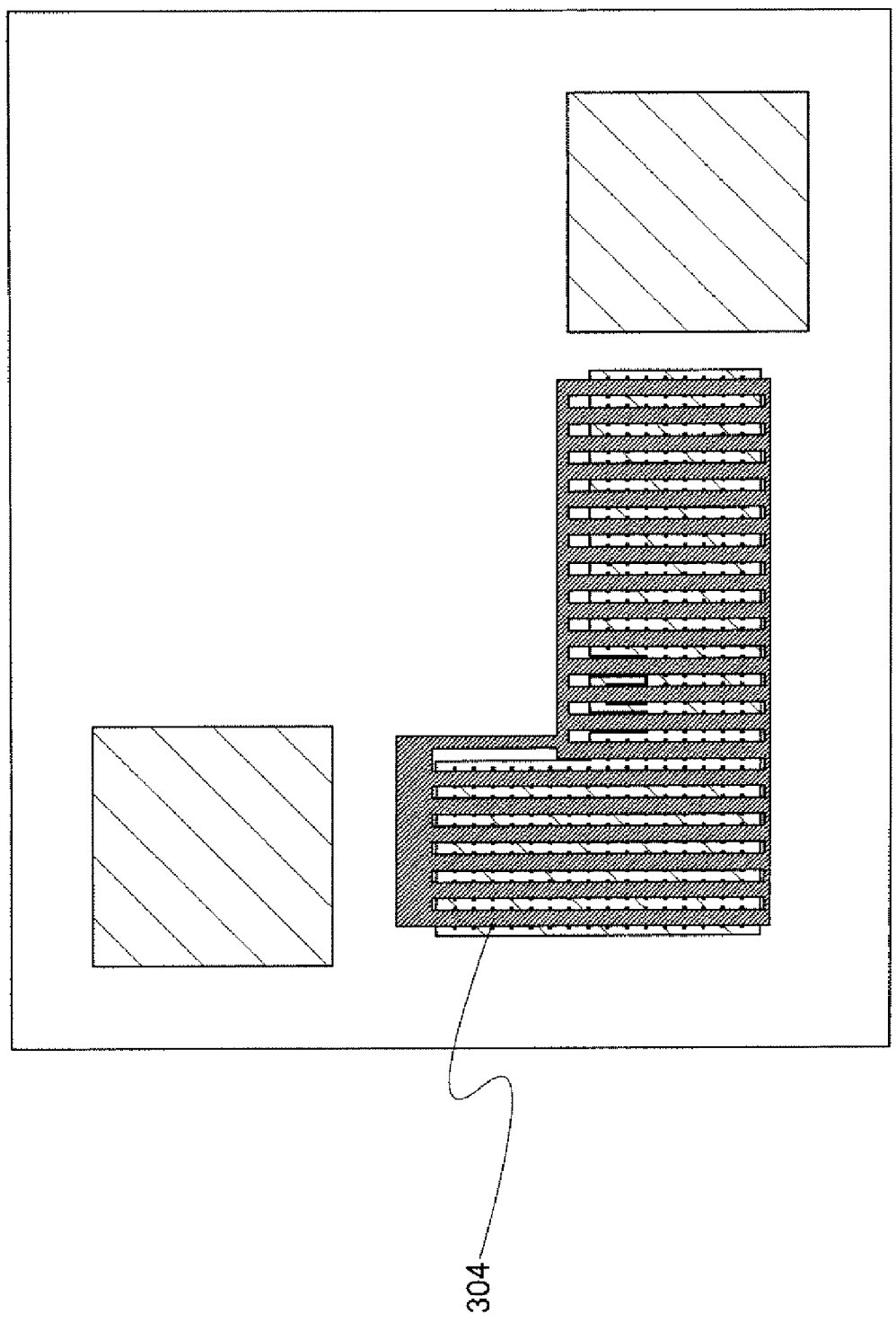
FIG. 10 is a plan schematic view illustrating an example of a method for manufacturing a semiconductor device in Embodiment 2

Subsequently, as illustrated in FIG. 10, the electrode 304 to be a first electrode is formed over part of the third semiconductor layer 303 with the first insulating film interposed therebetween.

The electrode 304 can be formed using a film (also referred to as a "metal film") formed of a material (also referred to as a "metal material") including a metal element such as tantalum, tungsten, titanium, molybdenum, aluminum, copper, chromium, or niobium, or the electrode 304 can also be formed by stacking these metal films. Alternatively, the electrode 304 can also be formed using an alloy film including the aforementioned metal material as a main component, or a film formed using a compound including the aforementioned metal element. Further alternatively, the electrode 304 can also be formed using a semiconductor film which is doped with an impurity element imparting conductivity (such as phosphorus). The electrode 304 can be formed by processing (patterning) the aforementioned film into a predetermined shape. In this embodiment, as an example, a tantalum nitride film is formed to a thickness of 30 nm and further a tungsten film is formed to a thickness of 170 nm over the tantalum nitride film, whereby the electrode 304 is formed.

Figure 11:
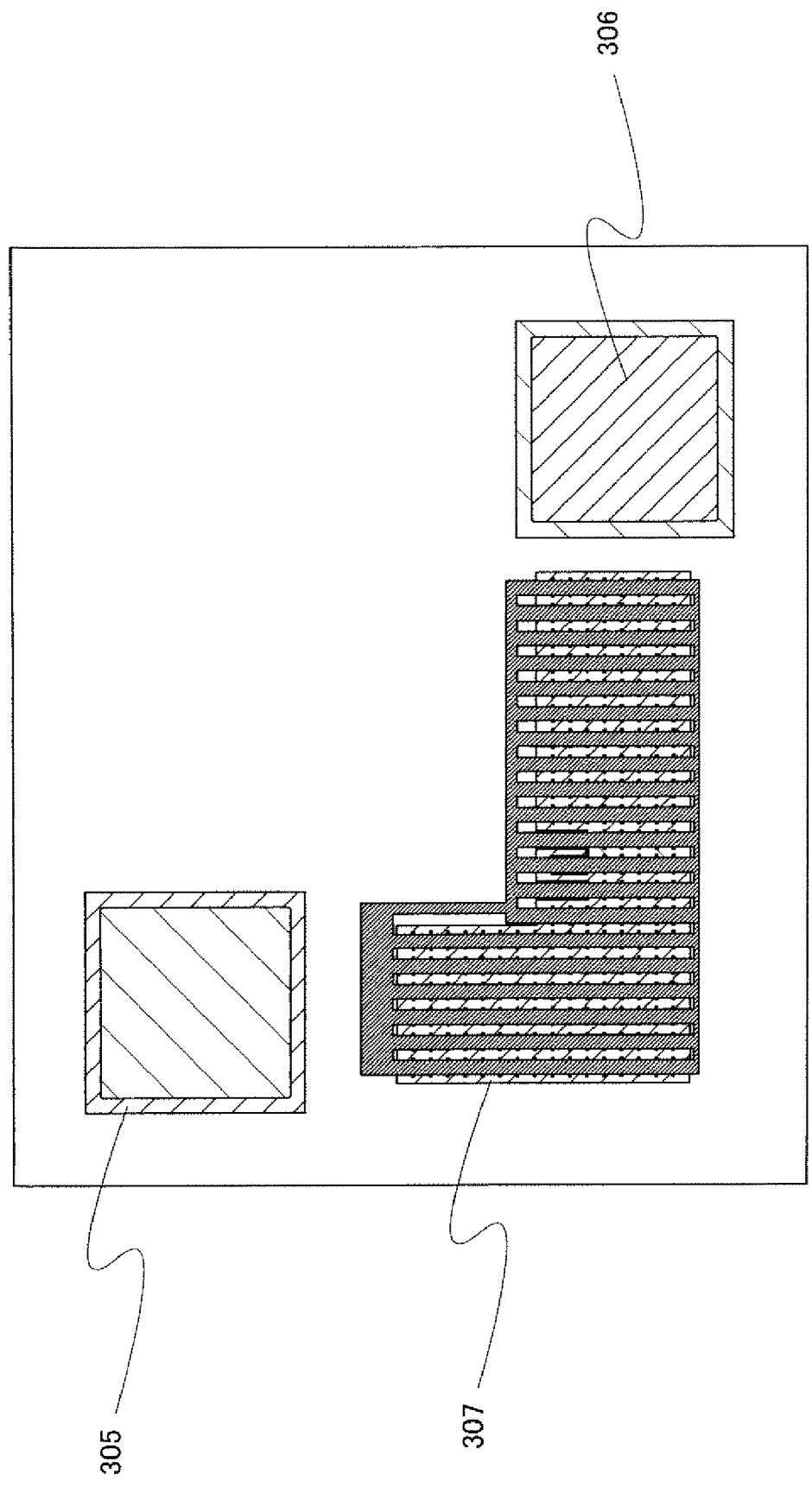
FIG. 11 is a plan schematic view illustrating an example of a method for manufacturing a semiconductor device in Embodiment 2.

Next, as illustrated in FIG. 11, as a step for adding a second impurity element, an impurity element imparting n-type conductivity (also referred to as an "n-type impurity element") is selectively added to the first semiconductor layer 301 through the third semiconductor layer 303, whereby a first n-type impurity region 305, a second n-type impurity region 306, and a third n-type impurity region 307 are formed. In this case, as the n-type impurity element, phosphorus, arsenic, or the like can be used, for example. Further, the n-type impurity element may be added to other components in addition to the first n-type impurity region 305, the second n-type impurity region 306, and the third n-type impurity region 307. In this embodiment, as an example, phosphorus is added under the following conditions: the acceleration voltage is 15 kV and the doping concentration is $1.0 \times 10^{15}$ cm$^{-3}$, so that the first n-type impurity region 305 through the third n-type impurity region 307 are formed.

Figure 12:
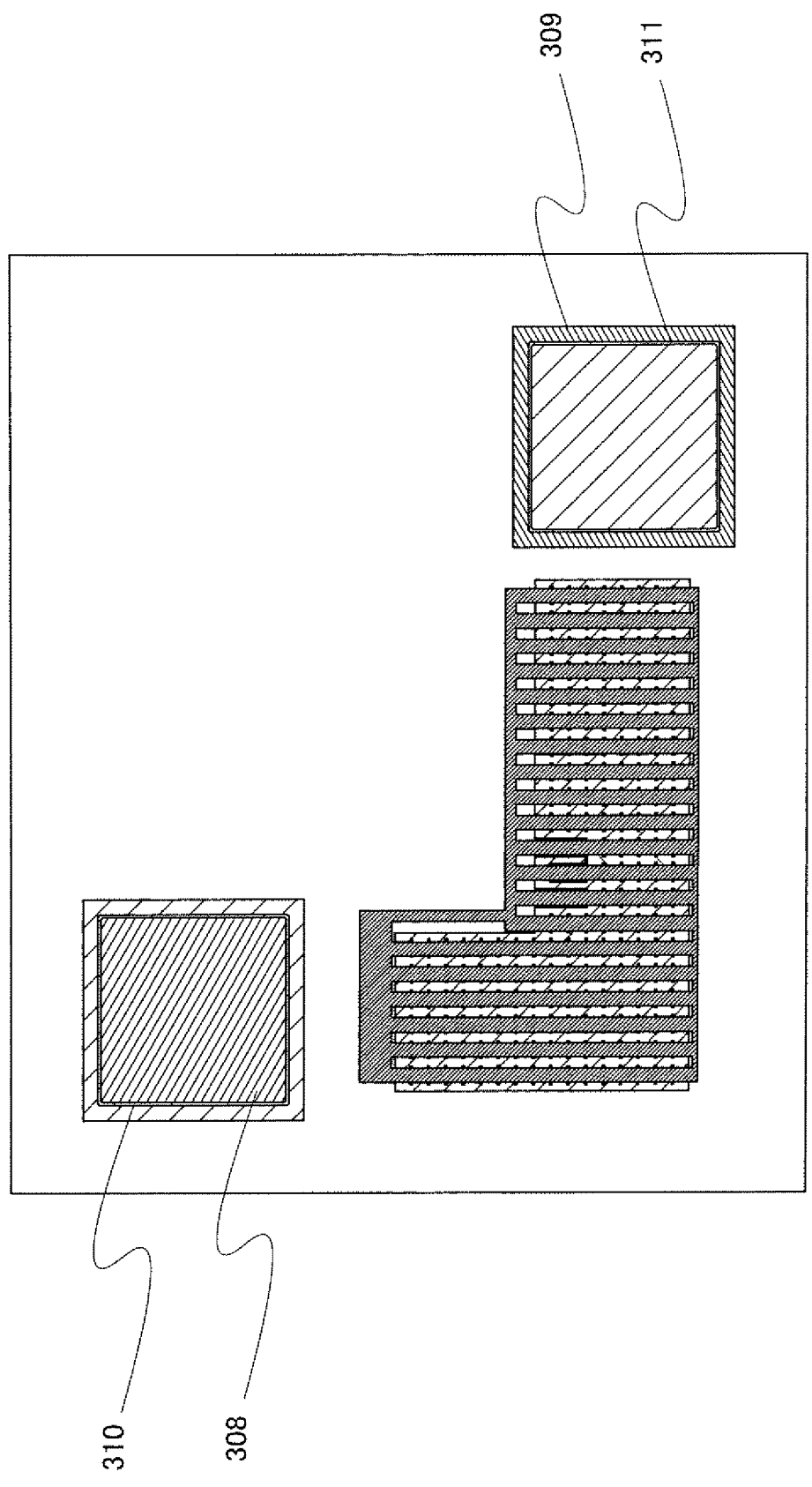
FIG. 12 is a plan schematic view illustrating an example of a method for manufacturing a semiconductor device in Embodiment 2.

Next, as illustrated in FIG. 12, as a step for adding a third impurity element, an impurity element imparting p-type conductivity (also referred to as a "p-type impurity element") is selectively added to the first semiconductor layer 301 through the third semiconductor layer 303, whereby a first p-type impurity region 308 and a second p-type impurity region 309 are formed. In this case, as the p-type impurity element, boron, aluminum, gallium, or the like can be used, for example. Further, it is preferable that the doping concentration of the impurity element that is added in the step for adding the third impurity element be higher than the doping concentration of the impurity element that is added in the aforementioned step for adding the first impurity element. In this embodiment, as an example, boron is added under the following conditions: the acceleration voltage is 20 kV and the doping concentration is $3.0 \times 10^{20}$ cm$^{-3}$, so that the first p-type impurity region 308 and the second p-type impurity region 309 are formed.

Note that in a plane view, the first p-type impurity region 308 is provided at an inner periphery portion of the first n-type impurity region 305 and the second n-type impurity region 306 is provided at an inner periphery portion of the second p-type impurity region 309.

Moreover, a region having a higher resistance value than the first n-type impurity region 305 and the first p-type impurity region 308 is provided between the first n-type impurity region 305 and the first p-type impurity region 308. This region is referred to as a "first resistance region" in this embodiment and is denoted as a first resistance region 310 in FIG. 12. The first resistance region 310 is provided at an outer periphery portion of the first p-type impurity region 308 and also at an inner periphery portion of the first n-type impurity region 305. In addition, a region having a higher resistance value than the second p-type impurity region 309 and the second n-type impurity region 306 is provided between the second p-type impurity region 309 and the second n-type impurity region 306. This region is referred to as a "second resistance region" in this embodiment and is denoted as a "second resistance region 311" in FIG. 12. The second resistance region 311 is provided at an outer periphery portion of the second n-type impurity region 306 and also at an inner periphery portion of the second p-type impurity region 309.

It is preferable that the first resistance region 310 and the second resistance region 311 each have a sheet resistance value of 10 kΩ or more. The sheet resistance value is set to 10 kΩ, whereby a protection operation can be performed more certainly when the overvoltage is supplied. Further, when the sheet resistance value is 10 kΩ or more, the n-type impurity element or the p-type impurity element may be added to parts or entire parts of the first resistance region 310 and the second resistance region 311.

Furthermore, a distance between the first n-type impurity region 305 and the first p-type impurity region 308 or a distance between the second p-type impurity region 309 and the second n-type impurity region 306 is denoted by L, and a perimeter of the first resistance region 310 or the second resistance region 311 is denoted by W. In this case, it is preferable that L be shorter and W be a certain length or more. By shortening L, the resistance value between the first n-type impurity region 305 and the first p-type impurity region 308 and the resistance value between the second p-type impurity region 309 and the second n-type impurity region 306 can be reduced to a value enough to perform a desired overvoltage protection operation. Moreover, when W is a certain length or more, an area where the overvoltage protection operation is performed can be increased. When L is shorter than a certain length, the leakage current is generated; accordingly, L is preferably designed to be a length at which the leakage current is not generated. Specifically, it is preferable that L be within the range of 2 μm≦L≦4 μm. In this embodiment, as an example, L/W=4 μm/2160 μm is satisfied.

In addition, it is preferable that the first n-type impurity region 305, the first resistance region 310, the first p-type impurity region 308, the second p-type impurity region 309, the second resistance region 311, and the second n-type impurity region 306 be each designed to have such a shape that the potential is uniformly provided to each of entire regions when the overvoltage is applied. The regions are each designed to have such a shape that the potential is uniformly provided to each of the entire regions, whereby the local concentration of an electric field in each of the regions can be suppressed.

A structure is employed in which the first resistance region 310 is provided at an inner periphery portion of the first n-type impurity region 305 and the first p-type impurity region 308 is provided at an inner periphery portion of the first resistance region 310, whereby the local concentration of an electric field in certain portions can be suppressed in the case where the potential is supplied from a potential supply terminal.

Further, a structure is employed in which the second resistance region 311 is provided at an inner periphery portion of the second p-type impurity region 309 and the second n-type impurity region 306 is provided at an inner periphery portion of the second resistance region 311, whereby the local concentration of an electric field in certain portions can be suppressed in the case where the potential is supplied from a potential supply terminal.

Next, although not illustrated for convenience, a second insulating film is formed over the electrode 304 and the first insulating film. For the second insulating film, a material which can be applied to the first insulating film 128 described in Embodiment 1 can be employed, for example. In this embodiment, as an example, a silicon nitride oxide film is formed to a thickness of 165 nm and further a silicon oxynitride film is formed to a thickness of 600 nm over the silicon nitride oxide film, whereby the second insulating film is formed.

Figure 13:
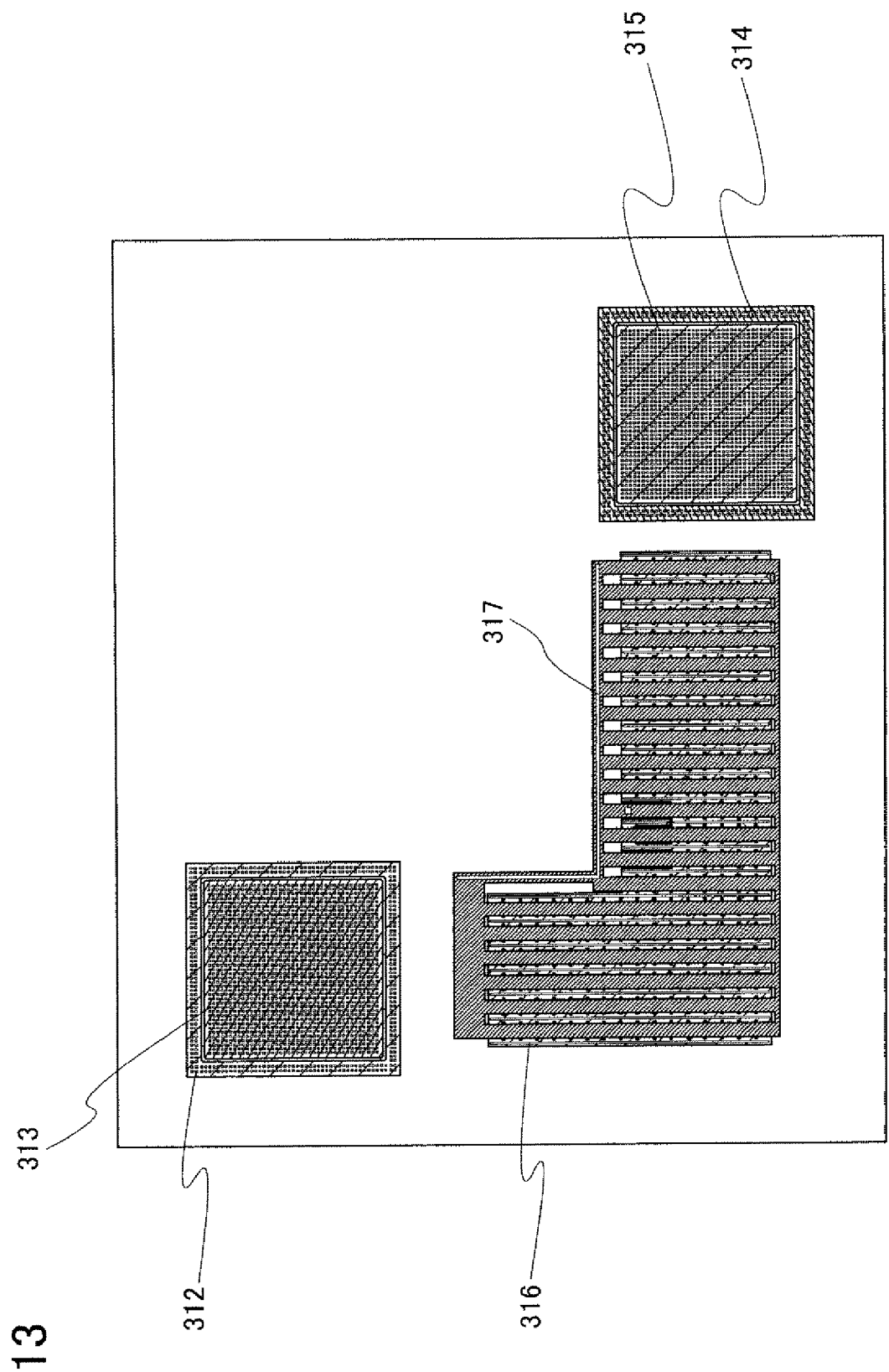
FIG. 13 is a plan schematic view illustrating an example of a method for manufacturing a semiconductor device in Embodiment 2.

Then, as illustrated in FIG. 13, in the second insulating film, a plurality of first opening portions 312 is selectively formed over the first n-type impurity region 305 in the first semiconductor layer 301, and a plurality of second opening portions 313 is selectively formed over the first p-type impurity region 308.

Further, in the second insulating film, a plurality of third opening portions 314 is selectively formed over the second p-type impurity region 309, and a plurality of fourth opening portions 315 is selectively formed over the second n-type impurity region 306 in the second semiconductor layer 302.

Furthermore, in the second insulating film, a plurality of fifth opening portions 316 is selectively formed over the third n-type impurity region 307 in the third semiconductor layer 303.

Furthermore, in the second insulating film, a sixth opening portion 317 is selectively formed over the electrode 304.

In this case, it is preferable that the plurality of first opening portions 312 through the plurality of fourth opening portions 315 be each formed at regular intervals so that the potential is uniformly provided to the semiconductor layer through the potential supply terminal.

Moreover, the plurality of fifth opening portions 316 is preferably formed at regular intervals so that the potential is uniformly provided to the third semiconductor layer 303 through the potential supply terminal.

Figure 14:
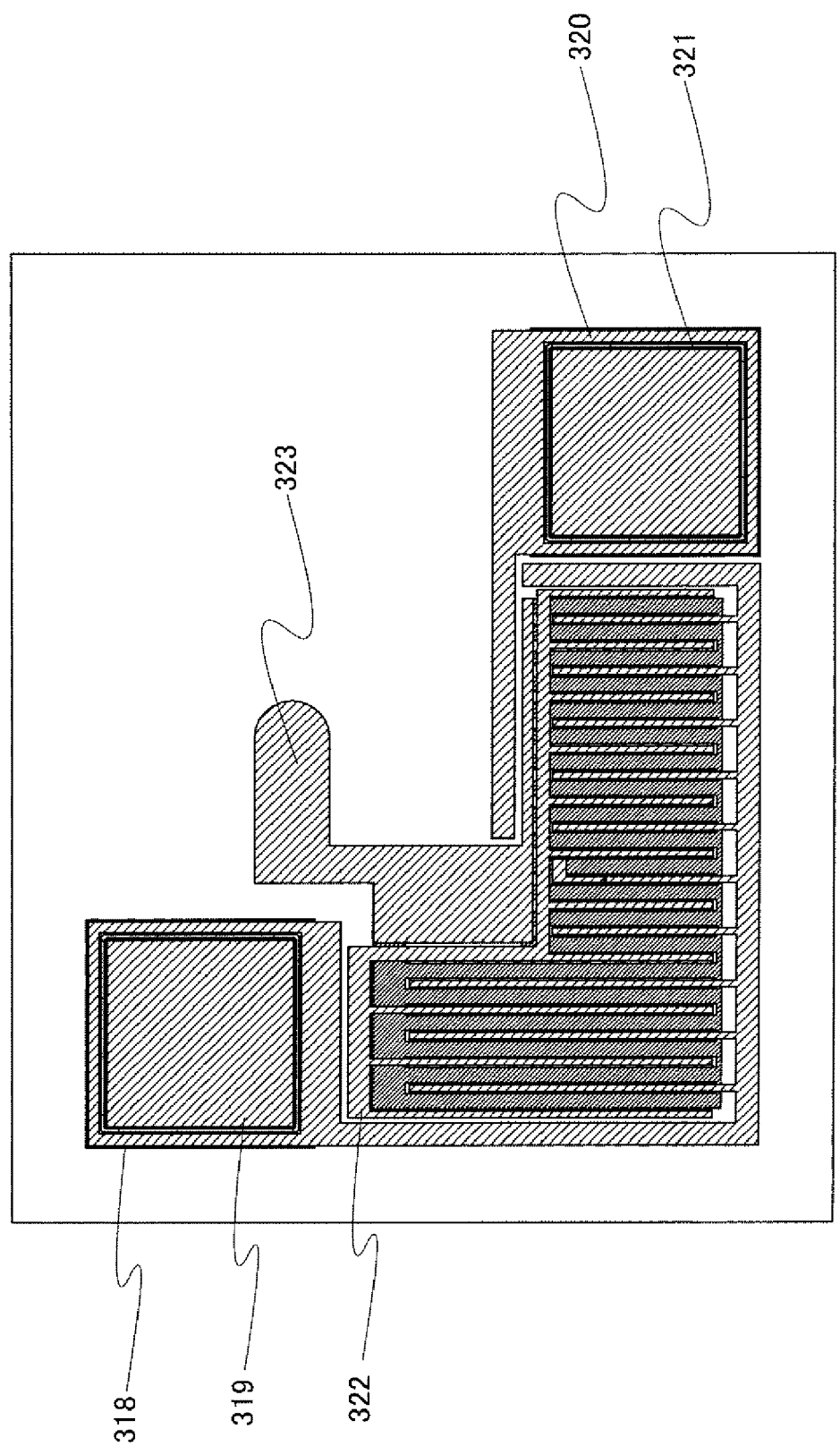
FIG. 14 is a plan schematic view illustrating an example of a method for manufacturing a semiconductor device in Embodiment 2.

Next, as illustrated in FIG. 14, an electrode 318 to be a second electrode is formed so as to be in contact with the first n-type impurity region 305 through the first opening portion 312 and so as to be in contact with the third semiconductor layer 303 through the fifth opening portion 316. An electrode 319 to be a third electrode is formed so as to be in contact with the first p-type impurity region 308 through the second opening portion 313. Further, an electrode 320 to be a fifth electrode is formed so as to be in contact with the second p-type impurity region 309 through the third opening portion 314, and an electrode 321 to be a fourth electrode is formed so as to be in contact with the second n-type impurity region 306 through the fourth opening portion 315. Furthermore, an electrode 322 to be a sixth electrode is formed so as to be in contact with the third n-type impurity region 307 in the third semiconductor layer 303 through the fifth opening portion 316. In addition, an electrode 323 to be a seventh electrode is formed so as to be in contact with the electrode 304 through the sixth opening portion 317.

For the electrode 318 through the electrode 323, materials which can be used for the first electrode 117 through the fourth electrode 120 in Embodiment 1 can be employed, for example. In this embodiment, as an example, a titanium film is formed to a thickness of 400 nm in order to form the electrode 318 through the electrode 323.

Note that it is preferable that in order to prevent the potential value provided to the third semiconductor layer 303 from being increased up to such a high value as to damage elements, a plurality of portions at which the second electrode 318 is in contact with the third n-type impurity region 307 in the third semiconductor layer 303 (also referred to as a "connection portion of the second electrode 318 and the third n-type impurity region 307") be provided, a plurality of portions at which the sixth electrode 322 is in contact with the third n-type impurity region 307 in the third semiconductor layer 303 (also referred to as a "connection portion of the sixth electrode 322 and the third n-type impurity region 307") be provided, the plurality of connection portions of the second electrode 318 and the third n-type impurity region 307 be designed to have such a shape or the like that the resistance values are uniform, and the plurality of connection portions of the sixth electrode 322 and the third n-type impurity region 307 be designed to have such a shape or the like that the resistance values are uniform. As an example, a semiconductor device in this embodiment has a structure in which the connection portion of the second electrode 318 and the third n-type impurity region 307 and the connection portion of the sixth electrode 322 and the third n-type impurity region 307 each have a comb shape and combs are provided at predetermined intervals so that the potential supply from each of the combs to the third n-type impurity region 307 is uniform, that is, the resistance values of each of the connection portions are uniform.

Figure 15:
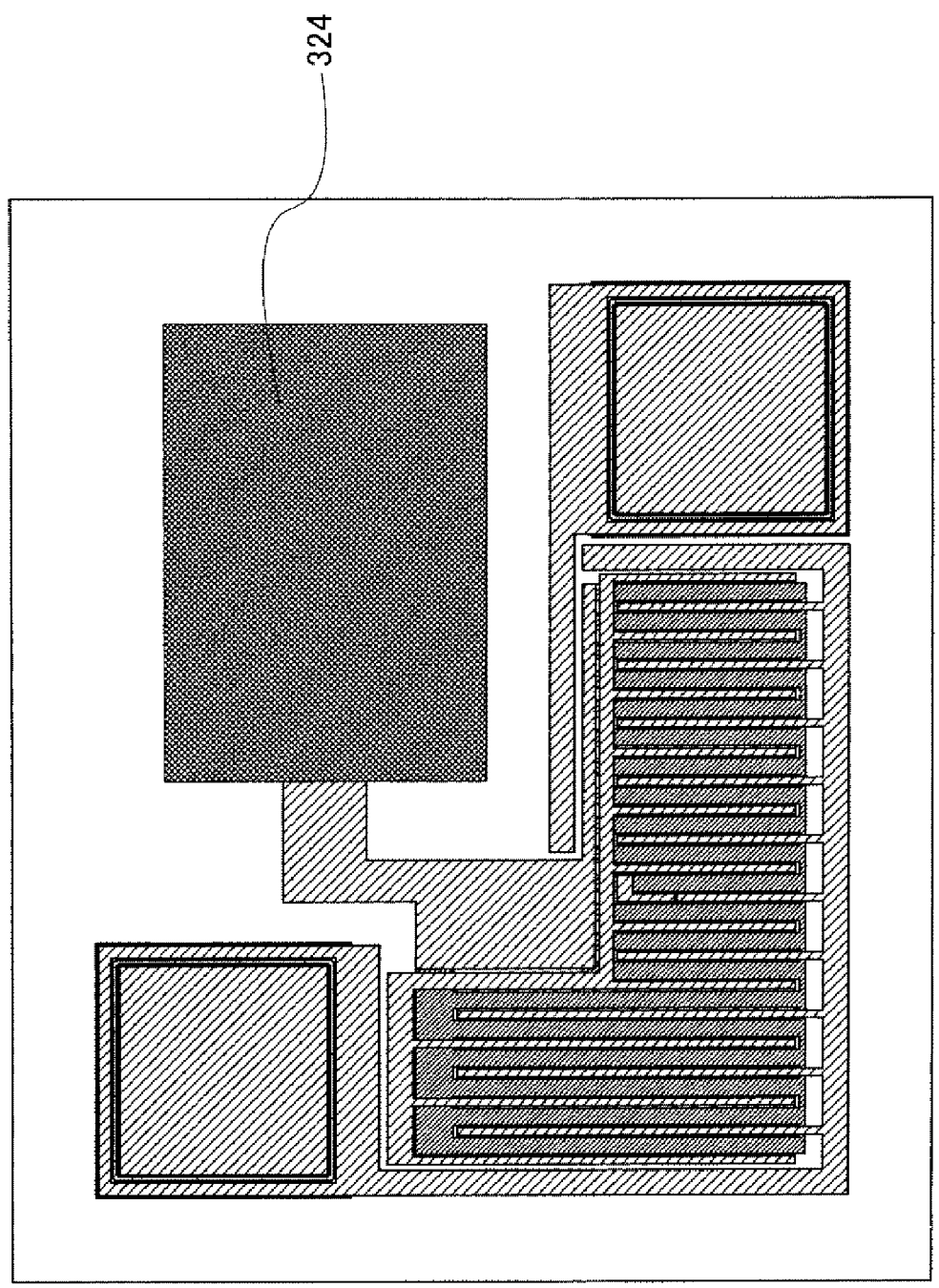
FIG. 15 is a plan schematic view illustrating an example of a method for manufacturing a semiconductor device in Embodiment 2.

Next, as illustrated in FIG. 15, a photoelectric conversion element is formed. A photoelectric conversion layer 324 is formed over part of the electrode 323, whereby the photoelectric conversion element is formed. The photoelectric conversion layer 324 is formed by stacking a p-type semiconductor layer having p-type conductivity, a semiconductor layer (also referred to as a "high-resistance semiconductor layer") having a higher resistance value than the p-type semiconductor layer and an n-type semiconductor layer, and the n-type semiconductor layer having n-type conductivity.

The p-type semiconductor layer can be formed using an amorphous semiconductor film, a single crystalline semiconductor film, a microcrystalline semiconductor film, or a polycrystalline semiconductor film formed by using a catalyst or laser crystallization treatment, each of which include an impurity element belonging to Group 13 of the periodic table such as boron, or the like, for example.

Further, as the high-resistance semiconductor layer, an amorphous semiconductor film, a single crystalline semiconductor film, a microcrystalline semiconductor film, a polycrystalline semiconductor film formed by using a catalyst or laser crystallization treatment, or the like can be formed, for example.

Furthermore, the n-type semiconductor layer can formed using an amorphous semiconductor film, a single crystalline semiconductor film, a microcrystalline semiconductor film, or a polycrystalline semiconductor film formed by using a catalyst or laser crystallization treatment, each of which include an impurity element belonging to Group 15 of the periodic table such as phosphorus, or the like, for example.

When a photoelectric conversion layer formed using, for example, microcrystalline silicon or single crystalline silicon is used for the semiconductor device in this embodiment, variation in characteristics of the photoelectric conversion layer over the substrate can be reduced. In this embodiment, as an example, a microcrystalline silicon film including boron is formed to a thickness of 100 nm by a plasma CVD method, a microcrystalline silicon film is formed to a thickness of 400 nm over the microcrystalline silicon film including boron, and a microcrystalline silicon film including phosphorus is formed to a thickness of 100 nm over the microcrystalline silicon film, whereby the photoelectric conversion layer 324 is formed.

Next, although not illustrated in FIG. 15 for convenience, a third insulating film is formed over the electrode 318 through the electrode 323, the photoelectric conversion layer 324, and the second insulating film.

For the third insulating film, any of materials which can be used for the second insulating film 129 described in Embodiment 1 can be employed, for example. In this embodiment, as an example, a silicon nitride oxide film is formed to a thickness of 100 nm and a silicon oxide film is formed using tetraethyl orthosilicate (abbreviation: TEOS, chemical formula: $Si(OC_2H_5)_4$) to a thickness of 800 nm over the silicon nitride oxide film, whereby the third insulating film is formed.

Figure 16:
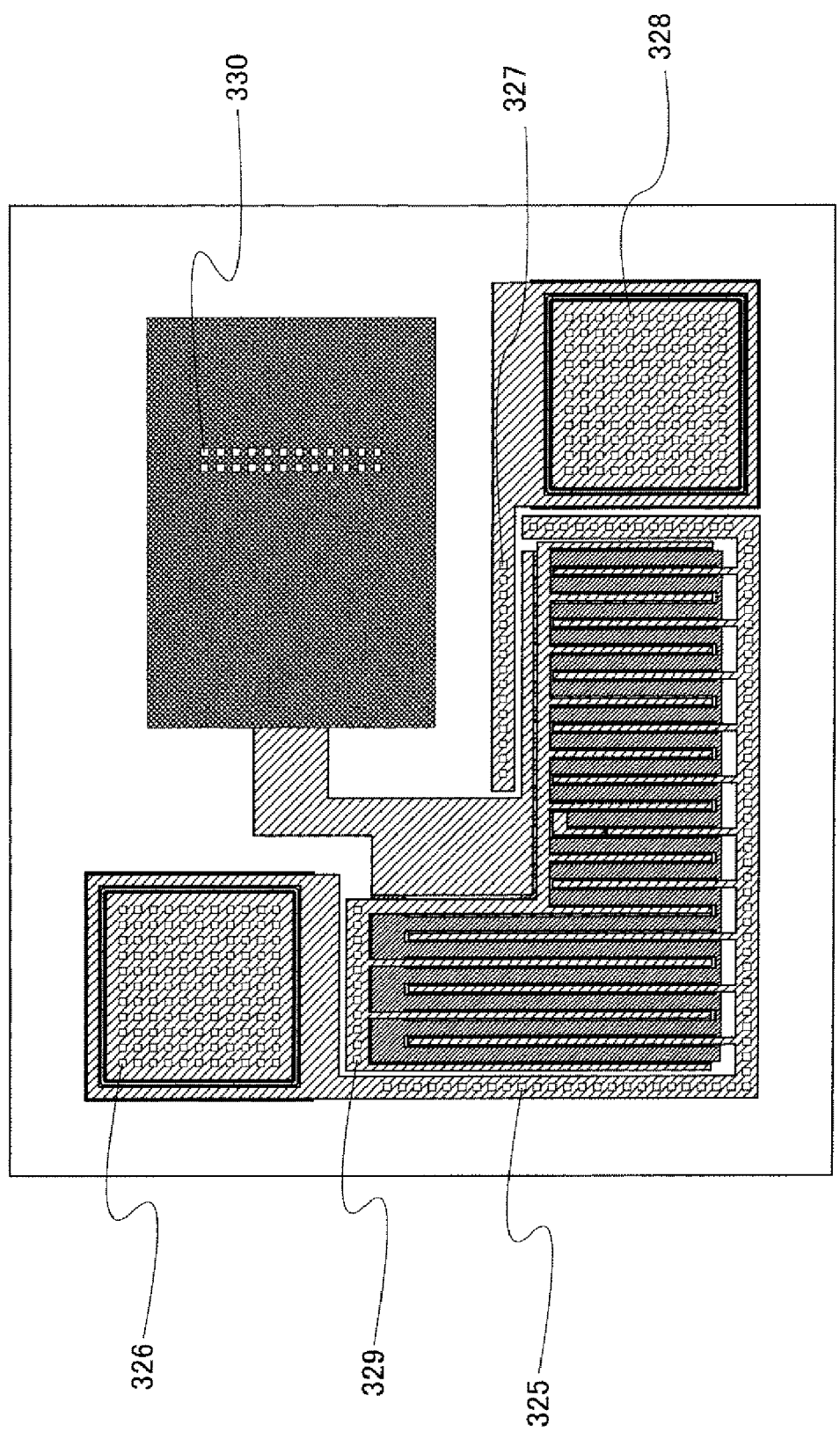
FIG. 16 is a plan schematic view illustrating an example of a method for manufacturing a semiconductor device in Embodiment 2.

Next, as illustrated in FIG. 16, in the third insulating film, a plurality of seventh opening portions 325 is selectively formed over the electrode 318 and a plurality of eighth opening portions 326 is selectively formed over the electrode 319.

Further, in the third insulating film, a plurality of ninth opening portions 327 is selectively formed over the electrode 320 and a plurality of tenth opening portions 328 is selectively formed over the electrode 321.

In the third insulating film, a plurality of eleventh opening portions 329 is selectively formed over the electrode 322.

Furthermore, in the third insulating film, a plurality of twelfth opening portions 330 is selectively formed over the photoelectric conversion layer 324.

In this case, it is preferable that the plurality of seventh opening portions 325 through the plurality of twelfth opening portions 330 be each formed at regular intervals so that the potential is uniformly provided through the potential supply terminal.

Figure 17:
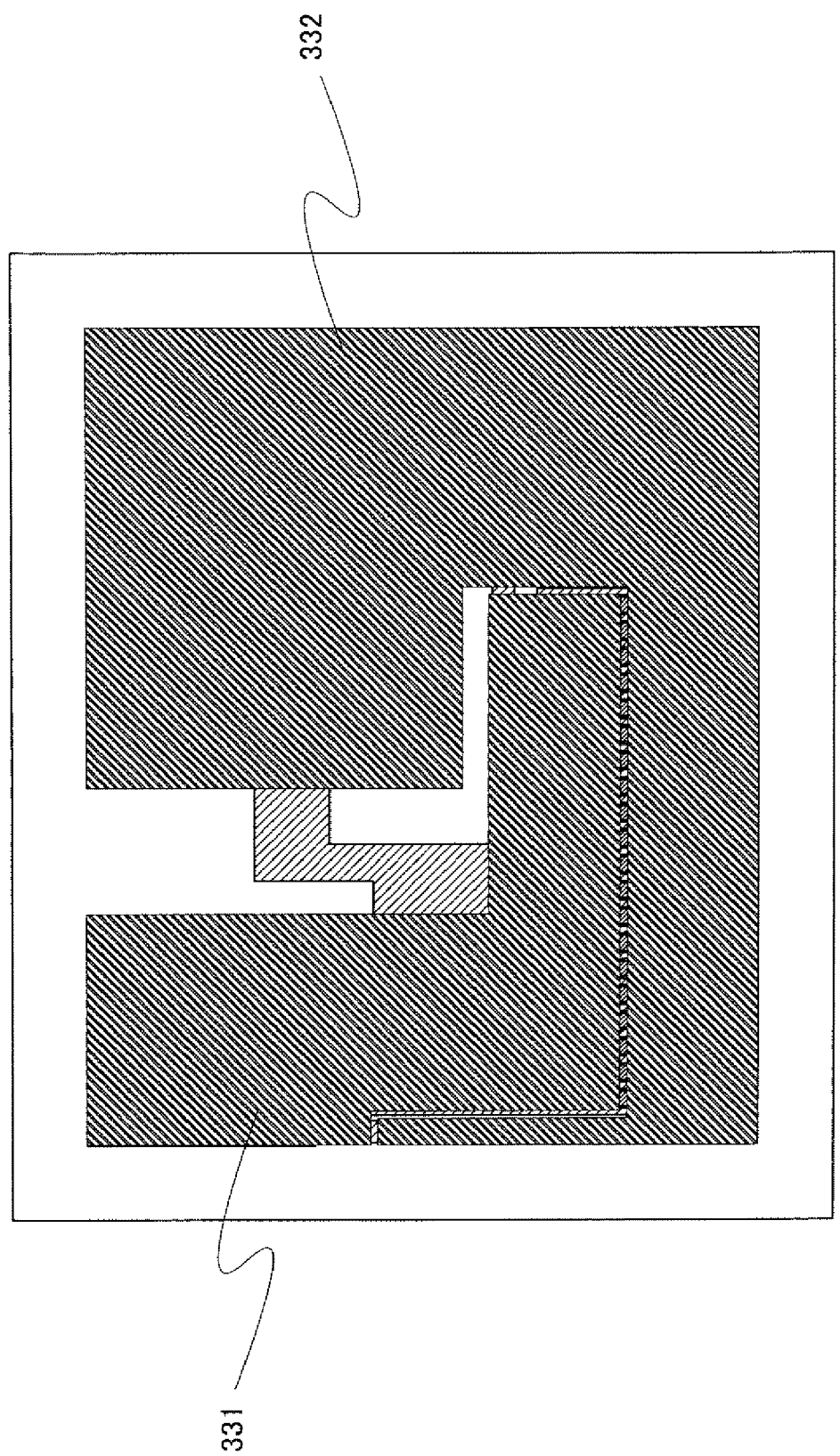
FIG. 17 is a plan schematic view illustrating an example of a method for manufacturing a semiconductor device in Embodiment 2.

Next, as illustrated in FIG. 17, an electrode 331 to be an eighth electrode is formed so as to be in contact with the electrode 319 through the eighth opening portion 326, so as to be in contact with the electrode 322 through the eleventh opening portion 329, and so as to be in contact with the electrode 320 through the ninth opening portion 327. Further, an electrode 332 to be a ninth electrode is formed so as to be in contact with the electrode 318 through the seventh opening portion 325, so as to be in contact with the electrode 321 through the tenth opening portion 328, and so as to be in contact with the n-type semiconductor layer in the photoelectric conversion layer 324 through the twelfth opening portion 330.

For the electrode 331 and the electrode 332, materials which can be used for the fifth electrode 125 and the sixth electrode 126 in Embodiment 1 can be employed, for example. In this embodiment, as an example, a titanium film is formed to a thickness of 200 nm, whereby the electrode 331 and the electrode 332 are formed.

Although not illustrated in FIG. 17 for convenience, a fourth insulating film is formed over the substrate 300, the electrode 331, and the electrode 332. By formation of the fourth insulating film, it is possible to prevent impurities such as moisture and an organic substance from entering into the photoelectric conversion layer 324 and the like.

Figure 18:
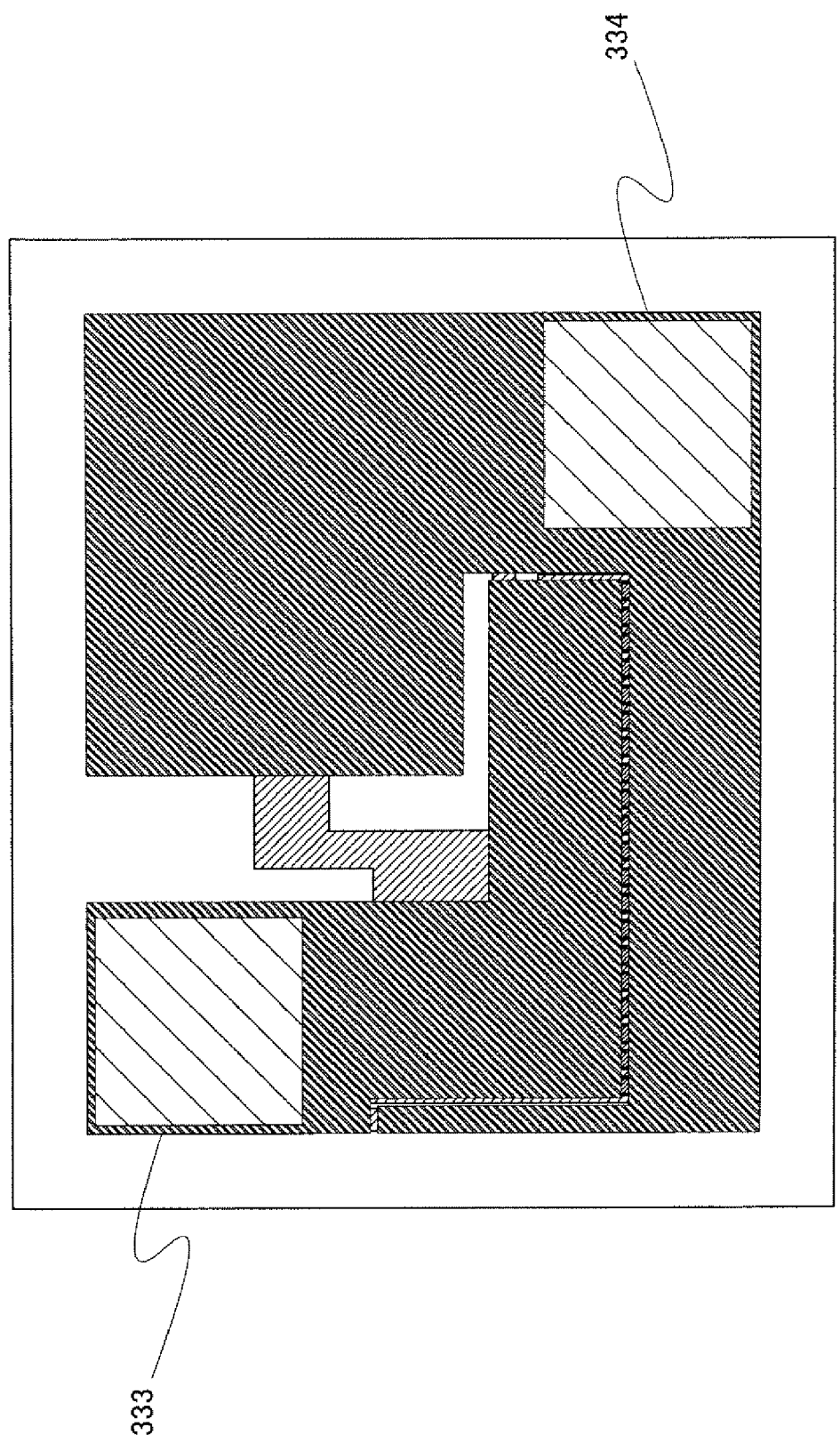
FIG. 18 is a plan schematic view illustrating an example of a method for manufacturing a semiconductor device in Embodiment 2.

Next, as illustrated in FIG. 18, in the fourth insulating film, a thirteenth opening portion 333 and a fourteenth opening portion 334 are formed. In this case, the thirteenth opening portion 333 is formed over the electrode 331 at a position over the first semiconductor layer 301. The fourteenth opening portion 334 is formed over the electrode 332 at a position over the second semiconductor layer 302.

Next, although not illustrated in FIG. 18 for convenience, a fifth insulating film is formed over the substrate 300, the electrode 331, the electrode 332, and the fourth insulating film.

Figure 19:
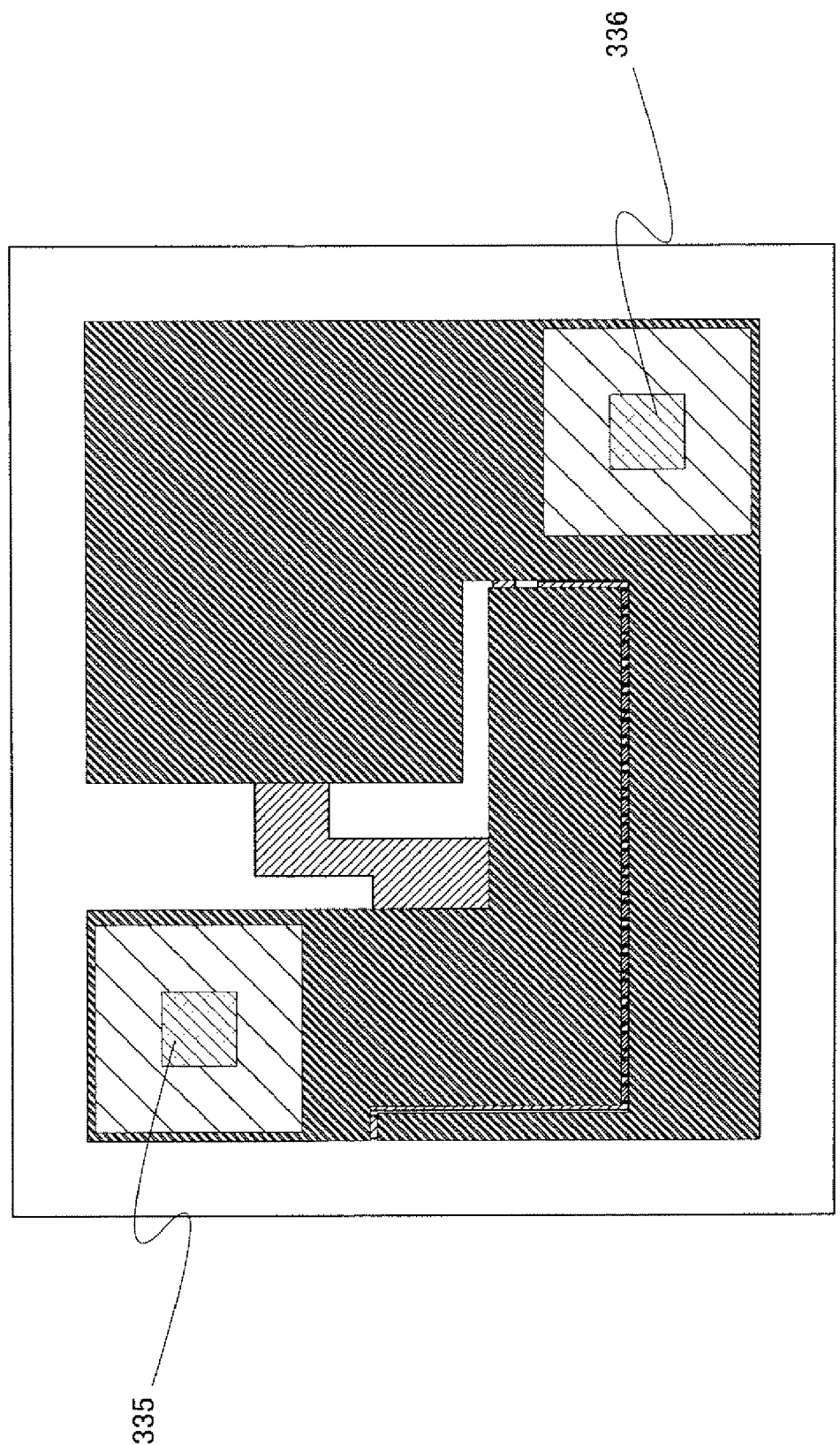
FIG. 19 is a plan schematic view illustrating an example of a method for manufacturing a semiconductor device in Embodiment 2.

Then, as illustrated in FIG. 19, in the fifth insulating film, a fifteenth opening portion 335 and a sixteenth opening portion 336 are formed. In this case, the fifteenth opening portion 335 is formed over the electrode 331 at a position over the first semiconductor layer 301 through the thirteenth opening portion 333. The sixteenth opening portion 336 is formed over the electrode 332 at a position over the second semiconductor layer 302 through the fourteenth opening portion 334.

Figure 20:
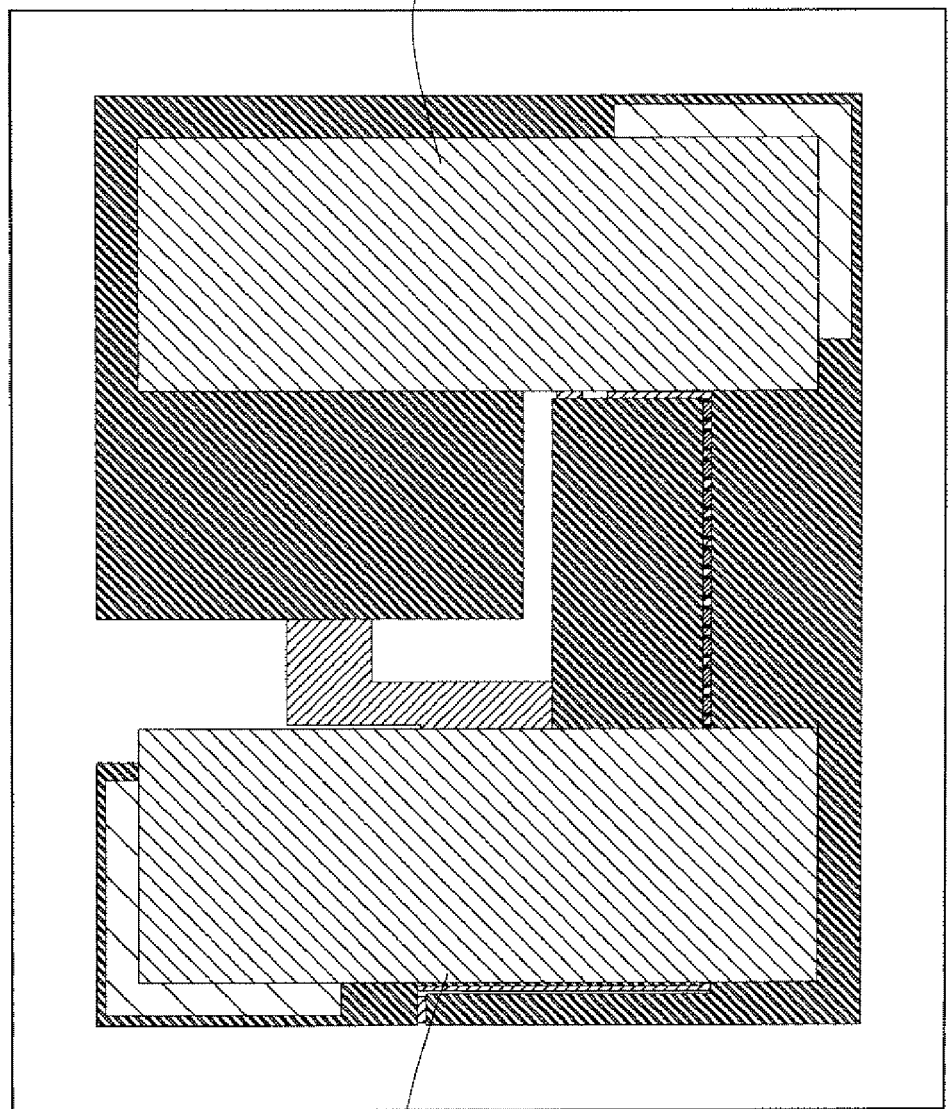
FIG. 20 is a plan schematic view illustrating an example of a method for manufacturing a semiconductor device in Embodiment 2.

Subsequently, as illustrated in FIG. 20, an electrode 337 is formed so as to be in contact with the electrode 331 through the fifteenth opening portion 335, and an electrode 338 is formed so as to be in contact with the electrode 332 through the sixteenth opening portion 336.

The electrode 337 and the electrode 338 can be formed using a film (also referred to as a "metal film") formed of a material (also referred to as a "metal material") including a metal element such as tantalum, tungsten, titanium, molybdenum, aluminum, gold, copper, chromium, or niobium, or the electrode 337 and the electrode 338 can also be formed by stacking these metal films. Alternatively, the electrode 337 and the electrode 338 can also be formed using an alloy film including the aforementioned metal material as a main component, or a film formed using a compound including the aforementioned metal element. Further alternatively, the electrode 337 and the electrode 338 can also be formed using a semiconductor film which is doped with an impurity element imparting conductivity (such as phosphorus). The aforementioned films are processed into a predetermined shape (such as patterning) in order to form the electrode 337 and the electrode 338.

Through the above steps, the semiconductor device in this embodiment is manufactured.

Figure 21:
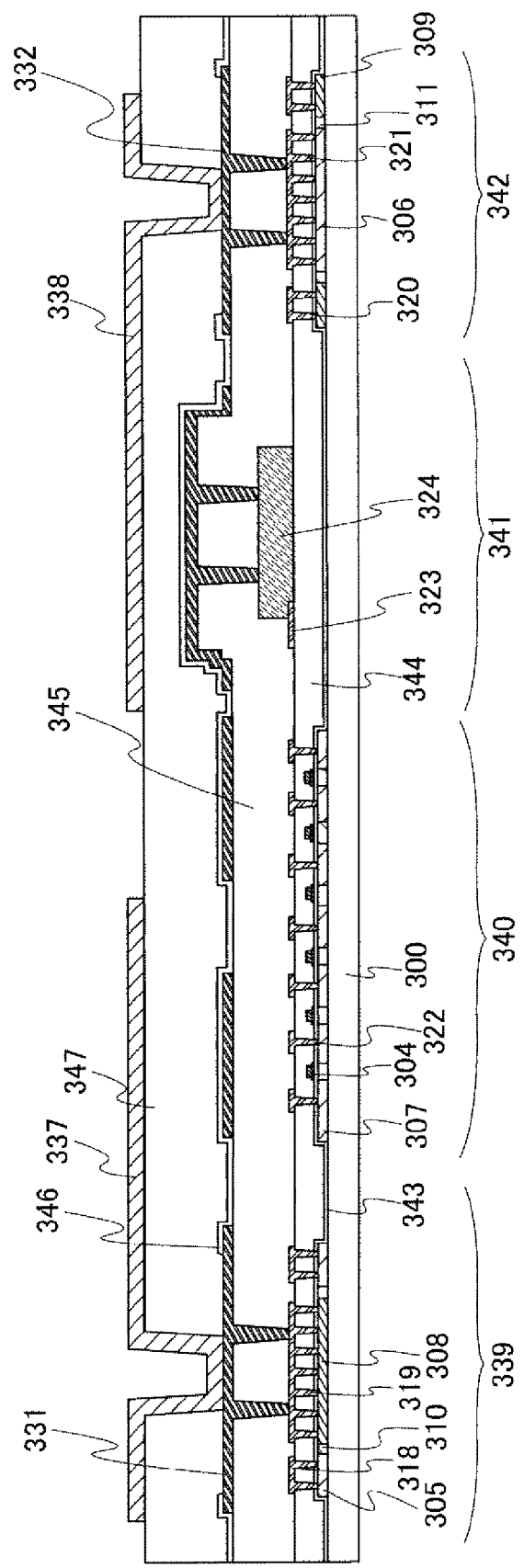
FIG. 21 is a cross-sectional schematic view illustrating an example of a cross-sectional structure of a semiconductor device manufactured through a manufacturing method illustrated in FIG. 9, FIG. 10, FIG. 11, FIG. 12, FIG. 13, FIG. 14, FIG. 15, FIG. 16, FIG. 17, FIG. 18, FIG. 19, and FIG. 20.

Further, a cross-sectional structure of the semiconductor device in this embodiment is described with reference to FIG. 21. FIG. 21 is a cross-sectional schematic view illustrating an example of a cross-sectional structure of a semiconductor device manufactured by a manufacturing method illustrated in FIG. 9, FIG. 10, FIG. 11, FIG. 12, FIG. 13, FIG. 14, FIG. 15, FIG. 16, FIG. 17, FIG. 18, FIG. 19, and FIG. 20. Note that dimensions different from actual dimensions are used for part of components in FIG. 21 for convenience. In this embodiment, as an example, a structure is described in which a semiconductor layer is provided over a substrate.

The semiconductor device illustrated in FIG. 21 includes a first potential supply portion 339, an amplifier circuit portion 340, a photoelectric conversion element portion 341, and a second potential supply portion 342. Note that the amplifier circuit portion 340 and the photoelectric conversion element portion 341 are also collectively referred to as a "photoelectric conversion circuit portion".

More specifically, the semiconductor device illustrated in FIG. 21 includes the substrate 300; the first semiconductor layer (the first semiconductor layer 301 in FIG. 9) provided over the substrate 300; the second semiconductor layer (the second semiconductor layer 302 in FIG. 9) provided over the substrate 300; the third semiconductor layer (the third semiconductor layer 303 in FIG. 9) provided over the substrate 300; a first insulating film 343 provided so as to cover the first semiconductor layer, the second semiconductor layer, and the third semiconductor layer; the electrode 304 selectively provided over the first insulating film 343 over the third semiconductor layer; a second insulating film 344 provided over the electrode 304 and the first insulating film 343; the electrode 318; the electrode 319; the electrode 320; the electrode 321; the electrode 322; the electrode 323; the photoelectric conversion layer 324 provided so as to be in contact with part of the electrode 323; a third insulating film 345 provided over the electrode 318, the electrode 319, the electrode 320, the electrode 321, the electrode 322, the electrode 323, the photoelectric conversion layer 324, and the second insulating film 344; the electrode 331 and the electrode 332 selectively provided over the third insulating film 345; a fourth insulating film 346 provided so as to cover part of the electrode 331 and part of the electrode 332; a fifth insulating film 347 provided over the fourth insulating film 346; the electrode 337; and the electrode 338.

In the first semiconductor layer, the first n-type impurity region 305, the first resistance region 310, and the first p-type impurity region 308 are selectively provided.

In the second semiconductor layer, the second p-type impurity region 309, the second resistance region 311, and the second n-type impurity region 306 are selectively provided.

In the third semiconductor layer, the third n-type impurity region 307 is selectively provided.

The electrode 304 is selectively provided over part of the first insulating film 343 over the third semiconductor layer. Note that the third n-type impurity region 307 is provided at a portion of the third semiconductor layer where the electrode 304 is not provided over the third semiconductor layer. Note that the electrode 304 has a two-layer structure in which a tungsten film is formed over a tantalum nitride film. The tungsten film is provided over part of the tantalum nitride film. A channel formation region is formed at a portion where the electrode 304 is provided over the third semiconductor layer 303.

Further, a region (also referred to as a "low-concentration impurity region") in which the concentration of the n-type impurity element is lower than that in the third n-type impurity region 307 can be provided between the third n-type impurity region 307 and the channel formation region. For example, n-type impurity elements are added from the electrode 304 side, whereby the low-concentration impurity region is provided in the third semiconductor layer 303 with part of the tantalum nitride film over which the tungsten film is not provided interposed therebetween.

The electrode 318 is provided in contact with the first n-type impurity region 305 through the first opening portion (the first opening portion 312 in FIG. 13) provided in the first insulating film 343 and the second insulating film 344.

The electrode 319 is provided in contact with the first p-type impurity region 308 through the second opening portion (the second opening portion 313 in FIG. 13) provided in the first insulating film 343 and the second insulating film 344.

The electrode 320 is provided so as to be in contact with the second p-type impurity region 309 through the third opening portion (the third opening portion 314 in FIG. 13) provided in the first insulating film 343 and the second insulating film 344.

The electrode 321 is provided so as to be in contact with the second n-type impurity region 306 through the fourth opening portion (the fourth opening portion 315 in FIG. 13) provided in the first insulating film 343 and the second insulating film 344.

The electrode 322 is provided so as to be in contact with the third n-type impurity region 307 through the fifth opening portion (the fifth opening portion 316 in FIG. 13) provided in the first insulating film 343 and the second insulating film 344.

The electrode 323 is provided so as to be in contact with the electrode 304 through the sixth opening portion (the sixth opening portion 317 in FIG. 13) provided in the first insulating film 343 and the second insulating film 344.

The electrode 331 is provided so as to be in contact with the electrode 319 through the eighth opening portion (the eighth opening portion 326 in FIG. 16) provided in the second insulating film 344 and the third insulating film 345, so as to be in contact with the electrode 320 through the ninth opening portion (the ninth opening portion 327 in FIG. 16) provided in the second insulating film 344 and the third insulating film 345, and so as to be in contact with the electrode 322 through the eleventh opening portion (the eleventh opening portion 329 in FIG. 16) provided in the second insulating film 344 and the third insulating film 345.

The electrode 332 is provided so as to be in contact with the electrode 318 through the seventh opening portion (the seventh opening portion 325 in FIG. 16) provided in the second insulating film 344 and the third insulating film 345, so as to be in contact with the electrode 321 through the tenth opening portion (the tenth opening portion 328 in FIG. 16) provided in the second insulating film 344 and the third insulating film 345, and so as to be in contact with the photoelectric conversion layer 324 through the twelfth opening portion (the twelfth opening portion 330 in FIG. 16) provided in the second insulating film 344 and the third insulating film 345.

The electrode 337 is provided so as to be in contact with the electrode 331 at a position over the first semiconductor layer 301 through the thirteenth opening portion (the thirteenth opening portion 333 in FIG. 18) and the fifteenth opening portion (the fifteenth opening portion 335 in FIG. 19) which are provided in the fourth insulating film 346 and the fifth insulating film 347, respectively.

The electrode 338 is provided so as to be in contact with the electrode 332 at a position over the second semiconductor layer 302 through the fourteenth opening portion (the fourteenth opening portion 334 in FIG. 8) and the sixteenth opening portion (the sixteenth opening portion 336 in FIG. 19) which are provided in the fourth insulating film 346 and the fifth insulating film 347, respectively.

Note that in this embodiment the positions of the first potential supply portion 339 and the second potential supply portion 342 are not especially limited to the positions illustrated in FIG. 21. However, for example, the first potential supply portion 339 is arranged in one of diagonally opposite corners of the substrate 300 and the second potential supply portion 342 is arranged in the other of the diagonally opposite corners so that a distance between the first potential supply portion 339 and the second potential supply portion 342 in a plane view can be increased. Thus, adverse effects of each potential supply portion can be suppressed.

Figure 22:
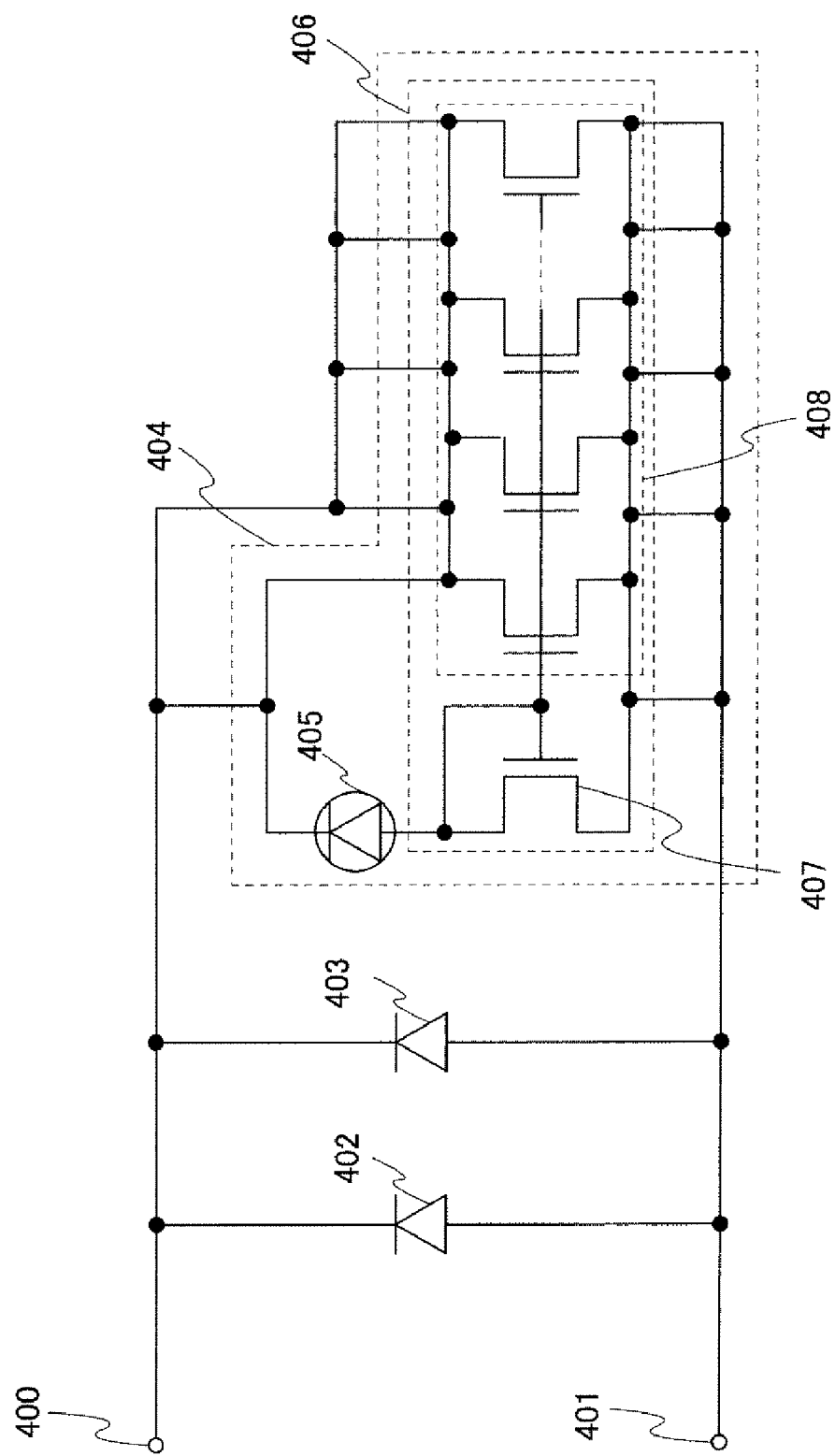
FIG. 22 is an equivalent circuit diagram illustrating an example of an equivalent circuit of a semiconductor device manufactured through a manufacturing method illustrated in FIG. 9, FIG. 10, FIG. 11, FIG. 12, FIG. 13, FIG. 14, FIG. 15, FIG. 16, FIG. 17, FIG. 18, FIG. 19, and FIG. 20.

Next, an equivalent circuit of the semiconductor device in this embodiment is described with reference FIG. 22. FIG. 22 is an equivalent circuit diagram illustrating an example of an equivalent circuit of a semiconductor device manufactured through a manufacturing method illustrated in FIG. 9, FIG. 10, FIG. 11, FIG. 12, FIG. 13, FIG. 14, FIG. 15, FIG. 16, FIG. 17, FIG. 18, FIG. 19, and FIG. 20.

As illustrated in FIG. 22, an equivalent circuit of the semiconductor device manufactured through a manufacturing method in this embodiment has a structure in which a first potential supply terminal 400 to which one of a potential of a relatively high-potential side (also referred to as "$V_{dd}$") and a potential of a relatively low-potential side (also referred to as "$V_{ss}$") is provided, a second potential supply terminal 401 to which the other of the potential of the relatively high-potential side and the potential of the relatively low-potential side is provided, a first diode 402, a second diode 403, and a photoelectric conversion circuit 404 are included.

Further, the photoelectric conversion circuit 404 has a structure in which a photoelectric conversion element 405 and an amplifier circuit 406 are provided.

Furthermore, the amplifier circuit 406 has a structure in which a current mirror circuit including a reference transistor 407 and an output transistor group 408 is provided.

A first terminal of the first diode 402 is electrically connected to the second potential supply terminal 401, and a second terminal is electrically connected to the first potential supply terminal 400.

A first terminal of the second diode 403 is electrically connected to the second potential supply terminal 401, and a second terminal is electrically connected to the first potential supply terminal 400.

In the photoelectric conversion circuit 404, a plurality of first terminals and a plurality of second terminals are provided. The plurality of first terminals is electrically connected to the first potential supply terminal 400, and the plurality of second terminals is electrically connected to the second potential supply terminal 401. Note that in FIG. 22, five of the plurality of first terminals and five of the plurality of second terminals are illustrated; however, the number of the first terminals and the second terminals is not limited to five.

In more specific, in the photoelectric conversion circuit 404, the photoelectric conversion element 405 includes a first terminal and a second terminal. The first terminal is connected to the amplifier circuit 406, and the second terminal is electrically connected to the amplifier circuit 406 and the first potential supply terminal 400.

In further more specific, in the amplifier circuit 406, the reference transistor 407 includes a gate terminal, a source terminal, and a drain terminal. The gate terminal is electrically connected to one of the source terminal and the drain terminal, one of the source terminal and the drain terminal is electrically connected to the first terminal of the photoelectric conversion element 405, and the other of the source terminal and the drain terminal is electrically connected to the second potential supply terminal 401.

The output transistor group 408 has a structure in which a plurality of transistors is connected in parallel, and in each of the transistors, the gate terminals are electrically connected to each other, the source terminals are electrically connected to each other, and the drain terminals are electrically connected to each other. Note that the number of the plurality of transistors is not limited to a particular number, and the number of the plurality of transistors is denoted by N (N is a natural number) in this embodiment. By increasing the number of the transistors, the output current (photocurrent) of the photoelectric conversion element 405 is amplified in accordance with the number of the transistors. For example, in the case where the output current of the photoelectric conversion element 405 is amplified 100-fold in the amplifier circuit 406, a structure may be applied in which the output transistor group 408 is formed using hundred transistors which are connected in parallel with respect to one reference transistor 407.

Further, in each of the transistors of the output transistor group 408, the gate terminal is electrically connected to the gate terminal of the reference transistor 407, one of the source terminal and the drain terminal is electrically connected to the first potential supply terminal 400 through the second terminal of the photoelectric conversion element 405 and the plurality of first terminals of the photoelectric conversion circuit 404, and the other of the source terminal and the drain terminal is electrically connected to the second potential supply terminal 401 through the plurality of second terminals of the photoelectric conversion circuit 404.

In the photoelectric conversion element 405, the photocurrent in accordance with illuminance of incident light is output. Note that as the photoelectric conversion element 405, a photodiode, a phototransistor, or the like can be applied, for example.

In the amplifier circuit 406, a value of the photocurrent which is output from the photoelectric conversion element 405 is amplified. Note that an example in which the amplifier circuit 406 has a structure in which a current mirror circuit is included is described in this embodiment; however, the structure of the amplifier circuit 406 is not limited thereto. Any other structure can be applied as long as a similar operation can be performed.

Further, in FIG. 22, one reference transistor 407 is illustrated; however, a structure may be employed in which the plurality of reference transistors 407 is provided. For example, the number of the transistors is changed, whereby the amplification factor of the amplifier circuit 406 can be approximately twice.

As illustrated in FIG. 22, as for the semiconductor device in this embodiment, it can be considered that two diodes are provided between a connection portion of the first potential supply terminal 400 and the first terminal of the photoelectric conversion circuit 404 and a connection portion of the second potential supply terminal 401 and a second terminal of the photoelectric conversion circuit 404.

Next, an operation of the semiconductor device in this embodiment is described with reference to FIG. 22.

First, the operation in the normal condition is described.

In the normal condition, a certain voltage (also referred to as a "first voltage") is applied between the first potential supply terminal 400 and the second potential supply terminal 401.

In this case, the first diode 402 and the second diode 403 are placed into the non-conductive state, and the first voltage is applied between the plurality of first terminals of the photoelectric conversion circuit 404 and the plurality of second terminals of the photoelectric conversion circuit 404.

The photoelectric conversion circuit 404 amplifies a current generated in the photoelectric conversion element 405, and outputs the amplified current. The operation of the photoelectric conversion circuit 404 is described below.

When the first voltage is applied, a reverse bias voltage is applied to the photoelectric conversion element, and a photocurrent in accordance with intensity of incident light is generated in the photoelectric conversion element 405. Then, a potential value of the gate terminal of each transistor in the reference transistor 407 included in the amplifier circuit 406 and a potential value of the gate terminal of each transistor in the output transistor group 408 included in the amplifier circuit 406 are equivalent. In this case, in the output transistor group 408, a current which flows through each transistor is approximately proportional to a current which flows through the reference transistor 407.

The photocurrent which is generated in the photoelectric conversion element 405 is amplified by the amplifier circuit 406 and is outputted. The above is the operation in the normal condition.

Next, an operation when the overvoltage is applied is described.

A voltage (also referred to as a "second voltage") which is the overvoltage is applied between the first potential supply terminal 400 and the second potential supply terminal 401.

In this case, the first diode 402 and the second diode 403 are in the placed into the conductive state. The second voltage is not applied between the plurality of first terminals of the photoelectric conversion circuit 404 and the plurality of second terminals of the photoelectric conversion circuit 404. Instead, a voltage which has a lower value than the second voltage is applied therebetween. Accordingly, elements are not damaged.

As described above, in the semiconductor device in this embodiment, when the overvoltage is applied, an overvoltage protection element including the first diode and the second diode is placed into the conductive state, whereby the overvoltage can be prevented from being applied to the photoelectric conversion circuit without changing the value. Accordingly, tolerance to the overvoltage can be increased.

Further, in the semiconductor device in this embodiment, an overvoltage protection circuit is provided at a potential supply portion, whereby increase in the circuit area of the semiconductor device can be suppressed.

Furthermore, in the semiconductor device in this embodiment, a plurality of potential supply portions for the photoelectric conversion circuit is provided, and the resistance in each potential supply portion is made uniform. Accordingly, part of an input portion of a photoelectric conversion circuit, for example, elements such as a transistor of an amplifier circuit can be prevented from being damaged due to potential supply to the photoelectric conversion circuit when the overvoltage is applied, whereby tolerance to the overvoltage can be increased.

In addition, in the semiconductor device in this embodiment, plural layers of electrodes are provided, and a potential supply portion is electrically connected to a photoelectric conversion circuit portion through the plural layers of electrodes. In this case, part of an input portion of the photoelectric conversion circuit, for example, elements such as a transistor of an amplifier circuit can be prevented from being damaged as compared to the case where a potential supply portion is electrically connected to a photoelectric conversion circuit portion through a single layer of electrode. Accordingly, damage to the elements can be suppressed, whereby tolerance to the overvoltage can be increased.

Note that this embodiment can be combined with any of the other embodiments as appropriate.

Embodiment 3

In this embodiment, examples of an electronic device provided with a semiconductor device which is one embodiment of the present invention will be described.

As examples of electronic devices to which the semiconductor device which is one embodiment of the present invention can be applied, computers, displays, mobile phones, television devices and the like are given. Specific examples of these electronic devices are illustrated in FIG. 23, FIGS. 24A and 24B, FIGS. 25A and 25B, FIG. 26, and FIGS. 27A and 27B. FIG. 23, FIGS. 24A and 24B, FIGS. 25A and 25B, FIG. 26, and FIGS. 27A and 27B illustrate structural examples of electronic devices of this embodiment.

Figure 23:
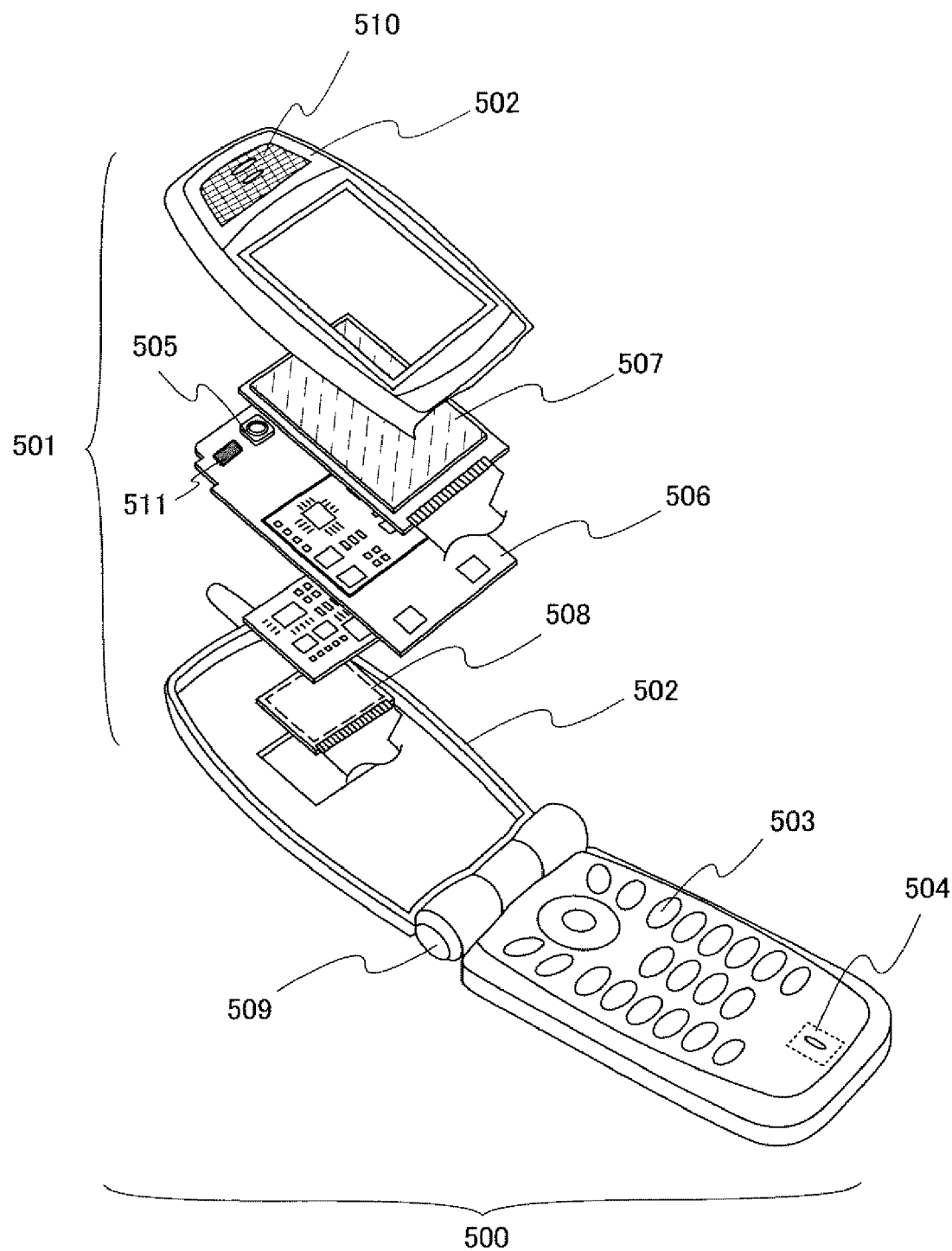
FIG. 23 is a diagram illustrating a structural example of an electronic device in Embodiment 3.

FIG. 23 illustrates a mobile phone which includes a main body (A) 500, a main body (B) 501, a housing 502, operation keys 503, an audio input portion 504, an audio output portion 505, a circuit substrate 506, a display panel (A) 507, a display panel (B) 508, a hinge 509, a light-transmitting material portion 510, and a photoelectric conversion device 511. The semiconductor device which is one embodiment of the present invention can be applied as the photoelectric conversion device 511.

The photoelectric conversion device 511 detects the light which is transmitted through the light-transmitting material portion 510, and luminance of the display panel (A) 507 and the display panel (B) 508 is controlled based on illuminance of detected ambient light, or illumination of the operation keys 503 is controlled based on illuminance obtained by the photoelectric conversion device 511. Accordingly, current consumption of the mobile phone can be reduced.

Figure 24A:
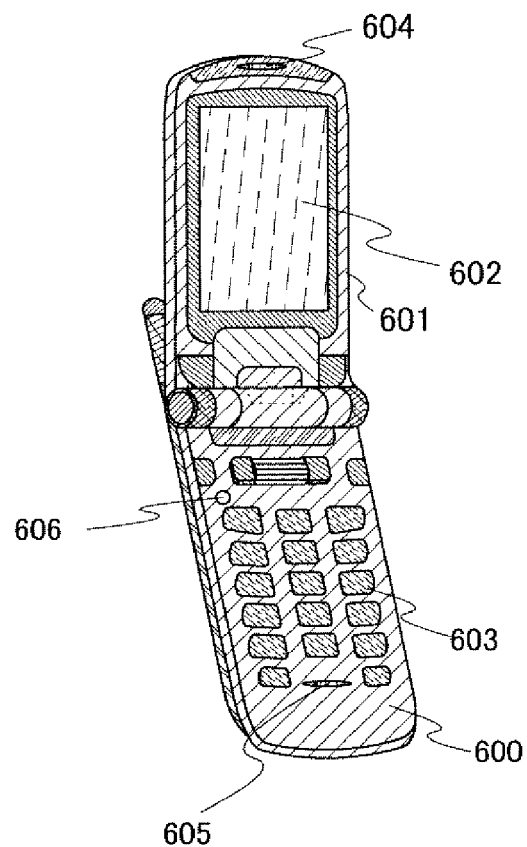
FIGS. 24A and 24B are diagrams each illustrating a structural example of an electronic device in Embodiment 3.
Figure 24B:
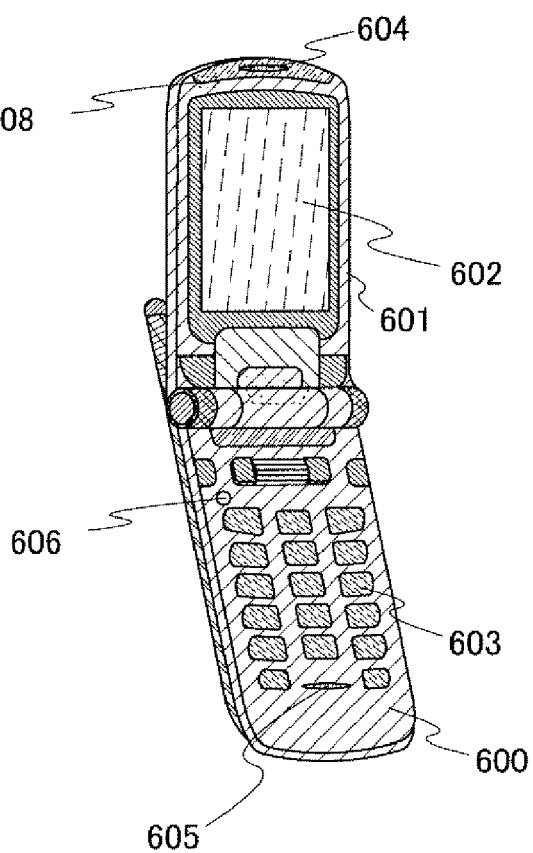

FIGS. 24A and 24B illustrate another example of a mobile phone. The mobile phone illustrated in FIGS. 24A and 24B includes a main body 600, a housing 601, a display panel 602, operation keys 603, an audio output portion 604, an audio input portion 605, a photoelectric conversion device 606, and a photoelectric conversion device 608. The semiconductor device which is one embodiment of the present invention can be applied as the photoelectric conversion device 606 and the photoelectric conversion device 608.

In the mobile phone illustrated in FIG. 24A, luminance of the display panel 602 and the operation keys 603 can be controlled by detecting ambient light with the use of the photoelectric conversion device 606 that is provided in the main body 600.

Further, in the mobile phone illustrated in FIG. 24B, the photoelectric conversion device 608 which is one embodiment of the semiconductor device is provided inside the main body 600 in addition to the structure of FIG. 24A. With the photoelectric conversion device 608, luminance of the backlight that is provided in the display panel 602 can also be detected.

Figure 25A:
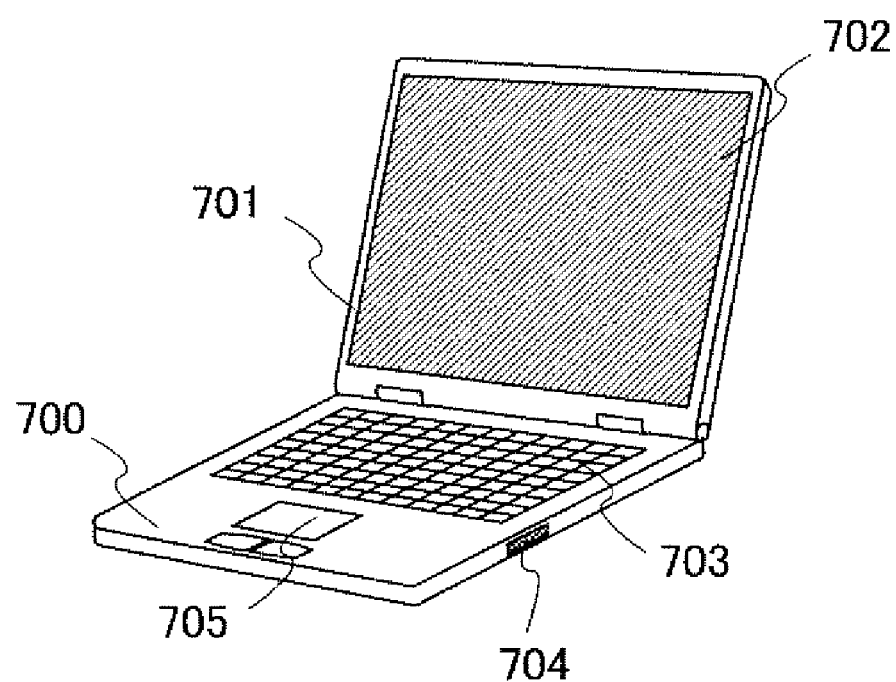
FIGS. 25A and 25B are diagrams each illustrating a structural example of an electronic device in Embodiment 3.

FIG. 25A illustrates a computer including a main body 700, a housing 701, a display portion 702, a keyboard 703, an external connection port 704, a pointing device 705, and the like.

Figure 25B:
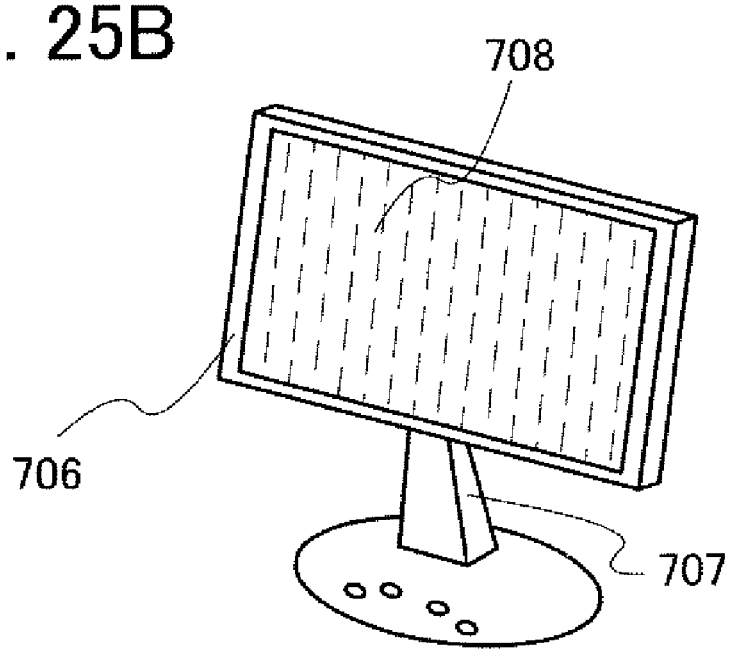

FIG. 25B illustrates a television device which is an example of a display device and includes a housing 706, a support base 707, a display portion 708, and the like.

Figure 26:
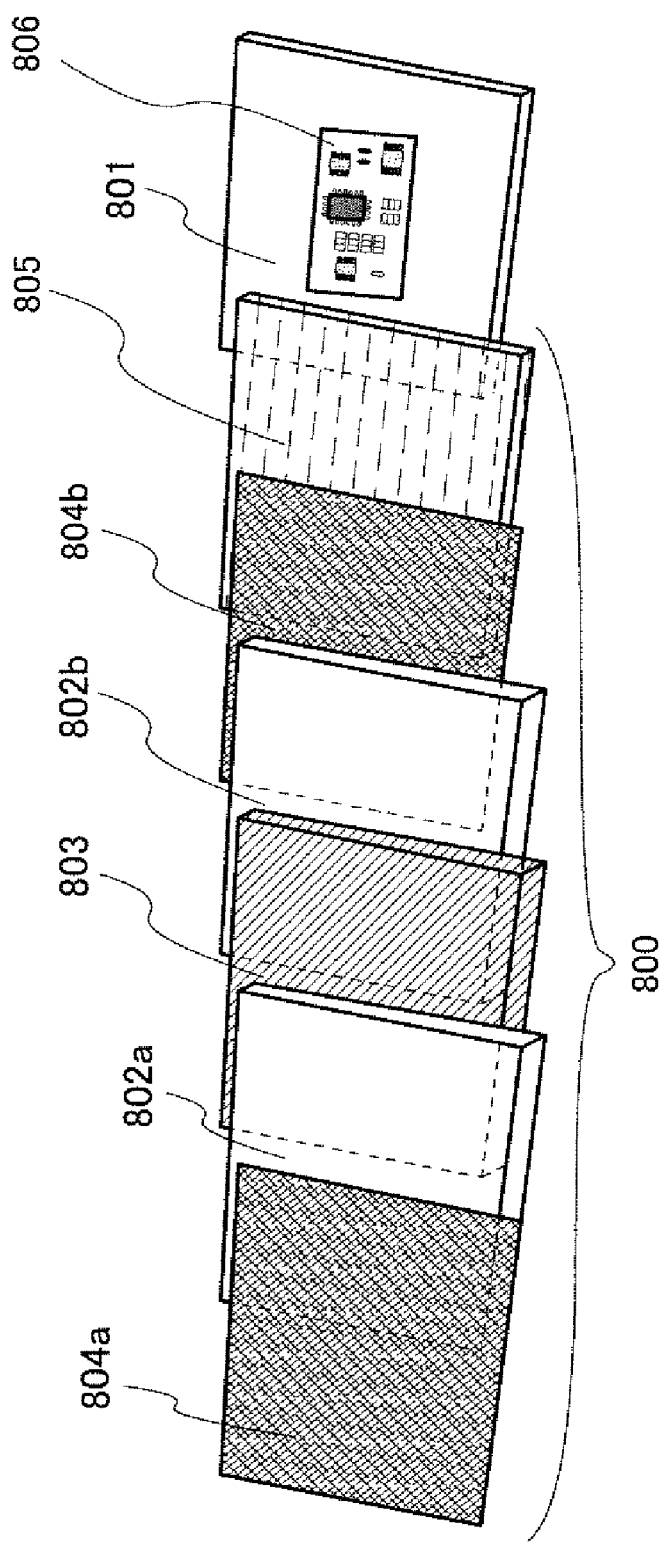
FIG. 26 is a diagram illustrating a structural example of an electronic device in Embodiment 3.

FIG. 26 illustrates a specific structure in the case of using a liquid crystal panel as the display portion 702 provided in the computer illustrated in FIG. 25A and as the display portion 708 of the display device illustrated in FIG. 25B.

A liquid crystal panel 800 illustrated in FIG. 26 is incorporated into a housing 801 and includes substrates 802*a* and 802*b*, a liquid crystal layer 803 interposed between the substrates 802*a* and 802*b*, polarizing filters 804*a* and 804*b*, a backlight 805, and the like. In addition, the housing 801 is provided with a photoelectric conversion device 806 as a semiconductor device which is one embodiment of the present invention.

The photoelectric conversion device 806 which is manufactured using a semiconductor device which is one embodiment of the present invention detects the amount of light from the backlight 805, and the information is fed back for adjusting luminance of the liquid crystal panel 800.

Figure 27A:
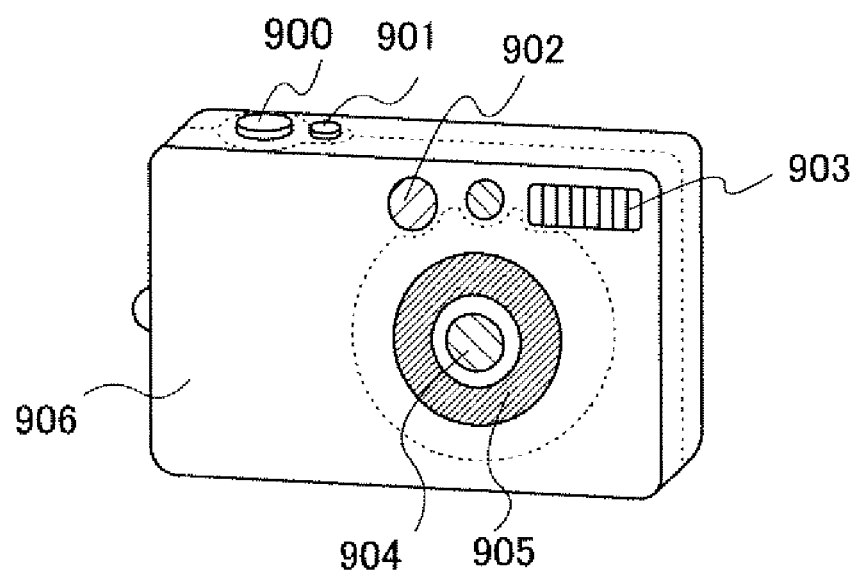
FIGS. 27A and 27B are diagrams each illustrating a structural example of an electronic device in Embodiment 3.
Figure 27B:
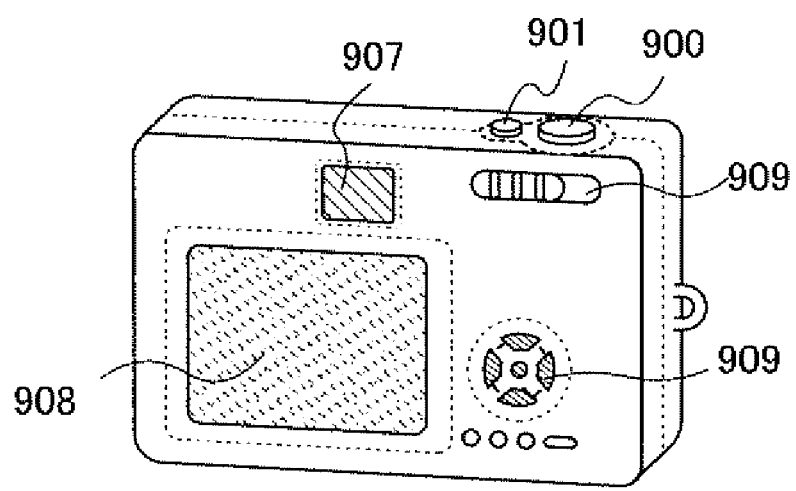

FIGS. 27A and 27B illustrate an example in which a semiconductor device which is one embodiment of the present invention is incorporated into a camera, for example, a digital camera, as the photoelectric conversion device. FIG. 27A is a front perspective view seen from the front side of the digital camera. FIG. 27B is a back perspective view seen from the back side of the digital camera. In FIG. 27A, the digital camera is provided with a release button 900, a main switch 901, a viewfinder 902, a flash portion 903, a lens 904, a lens barrel 905, and a housing 906.

In addition, in FIG. 27B, a viewfinder eyepiece 907, a monitor 908, and operation buttons 909 are provided.

When the release button 900 is pressed down halfway, a focusing adjusting mechanism and an exposure adjusting mechanism operate, and when the release button 900 is pressed down fully, a shutter opens.

The main switch 901 switches on or off of a power source of a digital camera by being pressed or rotated.

The viewfinder 902 is placed at the upper portion of the lens 904 of a front side of the digital camera and is a device for recognizing an area which is photographed or a focus position from the viewfinder eyepiece 907 illustrated in FIG. 27B.

The flash portion 903 is placed at the upper portion of the front side of the digital camera, and when object luminance is low, supporting light is emitted as soon as the release button is pressed down so that the shutter is opened.

The lens 904 is placed at the front face of the digital camera. The lens includes a focusing lens, a zoom lens, or the like, and forms a photographing optical system with a shutter and a diaphragm which are not illustrated. In addition, an image pickup device such as a charge coupled device (CCD) is provided at the back of the lens.

The lens barrel 905 is for moving a lens position to adjust the focus of the focusing lens, the zoom lens, and the like. In shooting, the lens barrel is slid out to move the lens 904 forward. In addition, when the camera is carried, the lens 904 is moved backward to make the camera compact. Note that a structure is employed in this embodiment, in which the lens barrel is slid out so that the object can be shot by being zoomed; however, the structure is not limited to this structure. Instead, a digital camera may employ a structure in which zoom shooting can be conducted without sliding out the lens barrel by a photographing optical system inside the housing 906.

The viewfinder eyepiece 907 provided at the upper portion of the back side of the digital camera is for looking therethrough when checking an area which is photographed or a focus point.

The operation buttons 909 are buttons for a variety of functions which are provided at the rear side of the digital camera and include a set up button, a menu button, a display button, a functional button, a selection button, and the like.

When a semiconductor device which is one embodiment of the present invention is incorporated into the camera illustrated in FIGS. 27A and 27B, the semiconductor device which is one embodiment of the present invention can serve as the photoelectric conversion device and can detect whether light exists or not and the light intensity; accordingly, an exposure adjustment or the like of the camera can be performed. In the semiconductor device which is one embodiment of the present invention, the overvoltage protection function can be performed without hindering an actual operation. Therefore, an electronic device which has high reliability on a malfunction and high optical sensitivity can be provided.

In addition, the semiconductor device which is one embodiment of the present invention can be applied to other electronic devices, for example, such as a projection television and a navigation system. That is, the semiconductor device can be applied to anything that is required to detect light.

Note that this embodiment can be combined with any of the other embodiments as appropriate.

Example 1

In this example, a semiconductor device actually manufactured which is one embodiment of the present invention will be described.

First, a structure of the semiconductor device manufactured in this example is described. The semiconductor device in this example includes a photoelectric conversion circuit. The semiconductor device in this example has the same structure as the semiconductor device including the photoelectric conversion circuit in Embodiment 2 and has a photoelectric conversion circuit portion including a first potential supply portion, a second potential supply portion, an amplifier circuit, and a photoelectric conversion element. Further, because the semiconductor device in this example was manufactured by a method which is the same as the method for manufacturing the semiconductor device in Embodiment 2, the description thereof is omitted.

Then, tolerance to the overvoltage of the semiconductor device in this example is described.

In order to confirm tolerance to the overvoltage of the semiconductor device in this example, a first overvoltage application test (also referred to as an "electrostatic test") was performed. Note that an electrostatic discharge simulator for semiconductors ESS-606A manufactured by NOISE LABORATORY CO., LTD. was used for the test, and the test was performed by using a Human Body Model test method. Further, it was judged that the semiconductor device was damaged when an output current was changed by ±20% from an initial output current after voltage was applied through the first potential supply portion and the second potential supply portion. Furthermore, the tests were performed on a semiconductor device (also referred to as a "first semiconductor device") in which an n-type impurity region, a p-type impurity region, and a semiconductor region including a resistance region having a quadrangular shape in a plane view are included in a potential supply portion, a semiconductor device (also referred to as a "second semiconductor device") in which an n-type impurity region, a p-type impurity region, and a semiconductor region including a resistance region having a polygonal shape in a plane view are included in a potential supply portion, and a semiconductor device (also referred to as a "third semiconductor device") in which an n-type impurity region, a p-type impurity region, and a semiconductor region including a resistance region are not included in a potential supply portion, with the use of a first sample to a fourth sample in each of the first to third semiconductor devices. Note that L/W of the resistance region in the potential supply portion included in the first semiconductor device is 4/2080. L/W of the resistance region in the potential supply portion included in the second semiconductor device is 4/4320.

Figure 28:
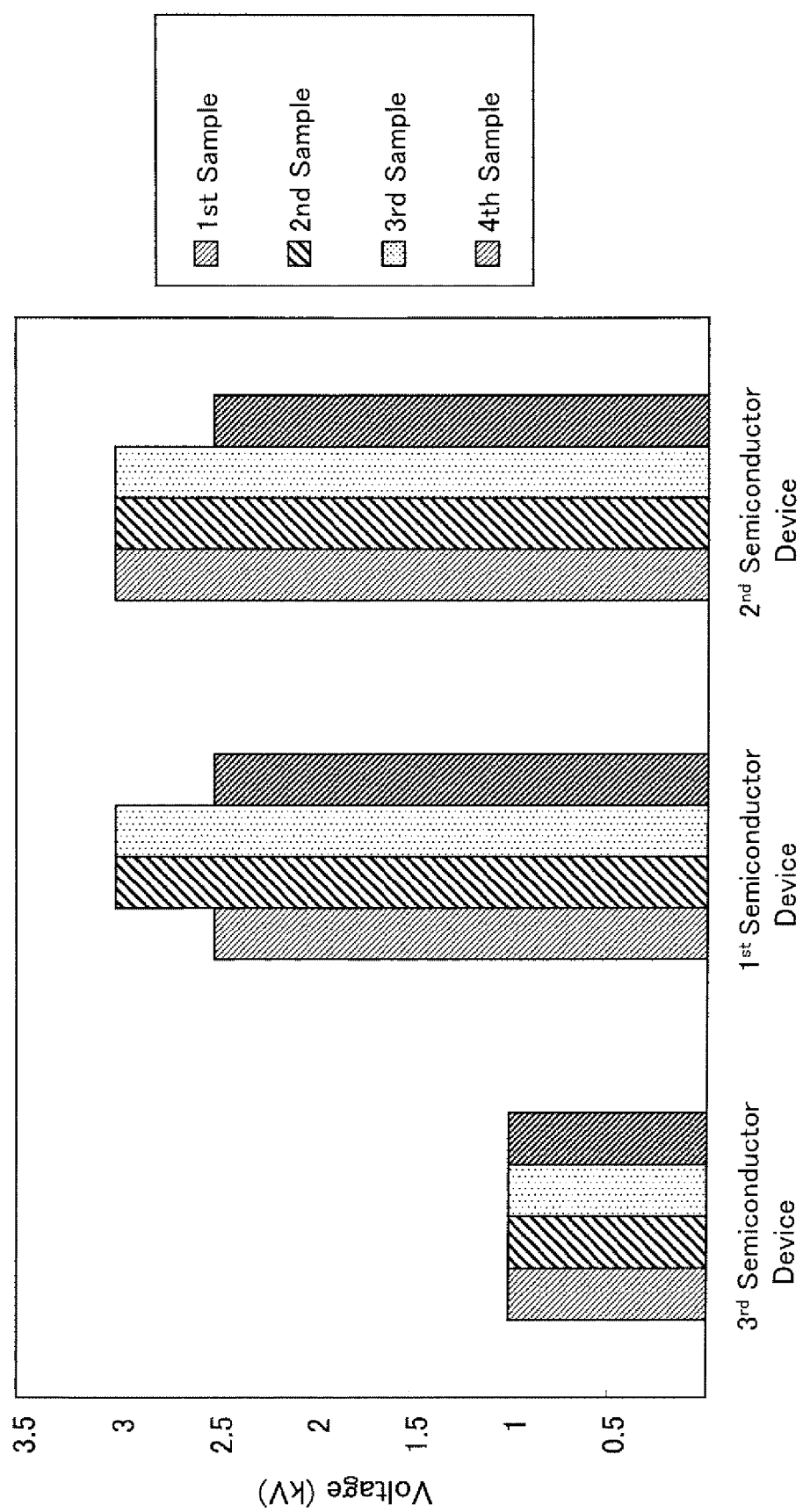
FIG. 28 is a graph illustrating a result of a first overvoltage test for a semiconductor device in Example 1.

A result of the aforementioned first overvoltage application test is described with reference to FIG. 28. FIG. 28 is a graph illustrating the result of the first overvoltage application test for the semiconductor device in this example.

As illustrated in FIG. 28, the third semiconductor device was damaged when a voltage higher than 1 kV was applied. On the other hand, the first semiconductor device and the second semiconductor device were not damaged until 3 kV. From the above, it was confirmed that tolerance to the overvoltage of the semiconductor device of the present invention was improved. Further, it was confirmed that W (a perimeter of the first resistance region 107 or the second resistance region 110 in FIG. 1) was longer than a certain length, whereby tolerance to the overvoltage was able to be increased.

Furthermore, as described in the above embodiment, in the semiconductor device of the present invention, L (a distance between the first n-type impurity region 106 and the first p-type impurity region 108 or a distance between the second p-type impurity region 109 and the second n-type impurity region 111 in FIG. 1) is reduced, whereby tolerance to the overvoltage can be improved. In this example, in order to obtain the optimal range of L, another sample which has a different structure from the sample used for the first overvoltage application test was manufactured, and a second overvoltage application test was performed. A schematic view of another sample is described with reference to FIG. 29.

Figure 29:
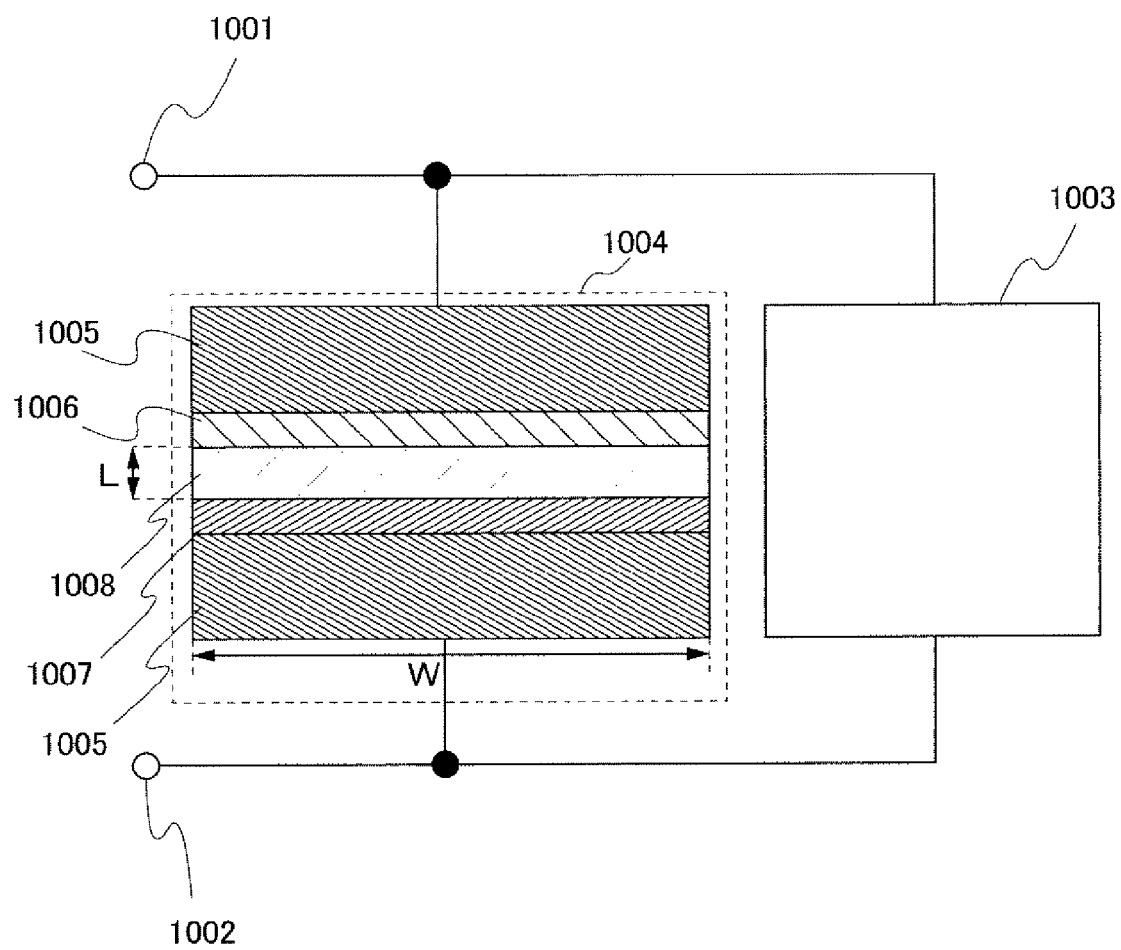
FIG. 29 is a schematic view illustrating a structure of a semiconductor device in Example 1.

As illustrated in FIG. 29, another sample has a structure in which a first potential supply terminal 1001, a second potential supply terminal 1002, a photoelectric conversion circuit portion 1003, and an overvoltage protection circuit portion 1004 are included. The photoelectric conversion circuit portion 1003 and the overvoltage protection circuit portion 1004 are electrically connected to the first potential supply terminal 1001 and the second potential supply terminal 1002.

Further, the overvoltage protection circuit portion 1004 includes an n-type impurity region 1006 and a p-type impurity region 1007 which are provided between two electrodes 1005 in a plane view and a resistance region 1008 which is provided between the n-type impurity region 1006 and the p-type impurity region 1007 in the plane view. In this case, a distance between the n-type impurity region 1006 and the p-type impurity region 1007, that is, a length of the resistance region 1008 in a short-side direction is denoted by L, and a length of the resistance region 1008 in a long-side direction is denoted by W. Note that in a similar manner to the first overvoltage application test, an electrostatic discharge simulator for semiconductors ESS-606A manufactured by NOISE LABORATORY CO., LTD. was used for the test and the test was performed by using a Human Body Model test method. In addition, a positive potential and the negative potential were applied to the first potential supply terminal 1001 as the overvoltage. It was judged that the semiconductor device was damaged when an output current was changed by ±20% from an initial output current after a voltage was applied through the first potential supply terminal 1001 and the second potential supply terminal 1002. Moreover, the measurement was performed with the use of a plurality of samples each in which W is 3000 µm and L is different from that of other ones.

Figure 30:
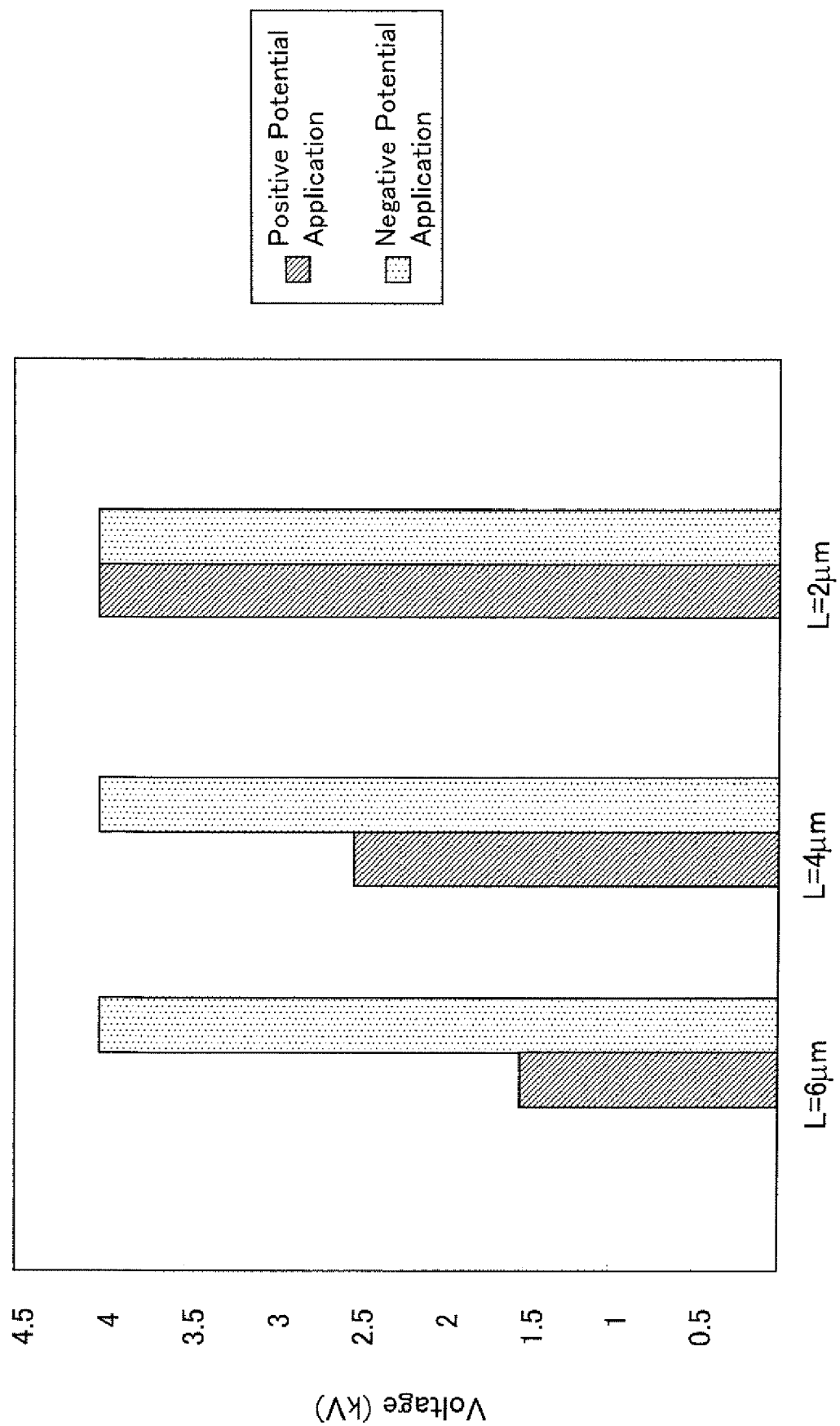
FIG. 30 is a graph illustrating a result of a second overvoltage test for a semiconductor device in Example 1.

First, as a first test result, a result of the second overvoltage test with the use of the plurality of samples each in which L is different from those of other ones is described with reference FIG. 30. FIG. 30 is a graph illustrating the result of the second overvoltage test in this example.

As illustrated in FIG. 30, in the case where L was equal to 4 µm, when a positive potential was applied, the photoelectric conversion circuit portion 1003 was not damaged until 2.5 kV. Further, in the case where L was equal to 2 µm, the photoelectric conversion circuit portion 1003 was not damaged until 4 kV. From this fact, it was confirmed that as the sample had the shorter L, the sample had a higher tolerance to the overvoltage. Furthermore, in the case where L was equal to 6 µm, the photoelectric conversion circuit portion 1003 was not damaged until 1.5 kV. However, this is the same as or substantially the same as the withstand voltage of the photoelectric conversion circuit portion 1003 in the case where the overvoltage protection circuit portion 1004 is not provided. Thus, it can be said that even if the overvoltage protection circuit portion 1004 is provided, the amount of improvement in tolerance to the overvoltage is extremely small. Accordingly, it can be said that in order to increase tolerance to the overvoltage, L is preferably set to less than or equal to 4 µm.

Figure 31:
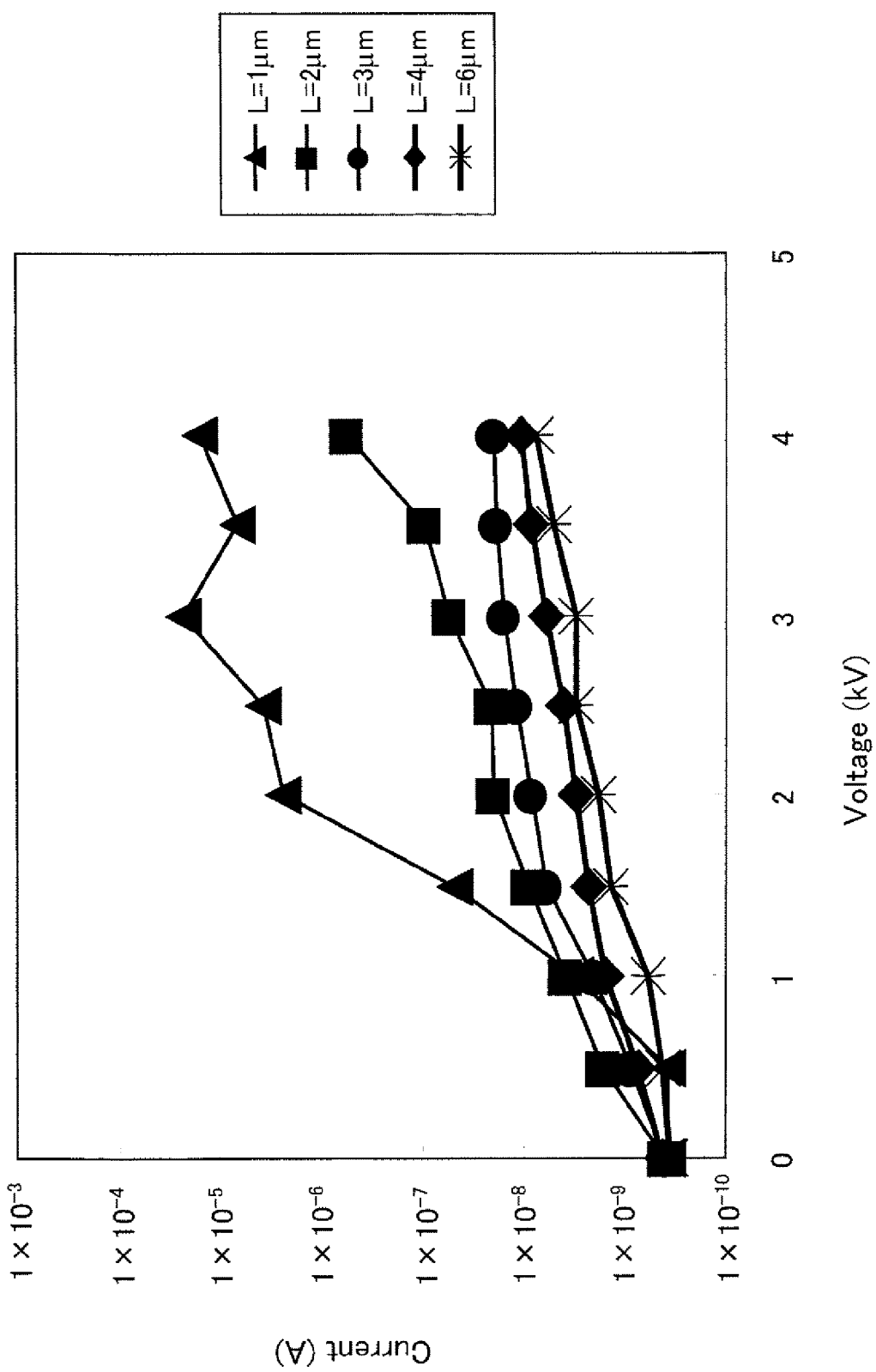
FIG. 31 is a graph illustrating a measurement result of the leakage current in a protection circuit portion of a semiconductor device in Example 1 after the overvoltage is applied.

Next, FIG. 31 illustrates, as a second test result, a measurement result of the leakage current of the overvoltage protection circuit portion 1004 after the overvoltage is applied.

As illustrated in FIG. 31, in the case where L was in the range of 2 µm to 6 µm, the value of the leakage current was less than $10^{-6}$ A. On the other hand, in the case where L was equal to 1 µm, the value of the leakage current was rapidly increased to greater than $1\times10^{-6}$ A after the overvoltage of greater than or equal to 1 kV was applied. From this fact, it can be found that L is preferably in the range of 2 µm to 6 µm.

From FIG. 30 and FIG. 31, it can be found that in the case where suppressing the leakage current and increasing tolerance to the overvoltage are taken into consideration, L is preferably greater than or equal to 2 µm and less than or equal to 4 µm, as also described in the above embodiment.

From the above, it was confirmed that tolerance to the overvoltage of the semiconductor device in this example was increased.

This application is based on Japanese Patent Application serial no. 2008-165204 filed with Japan Patent Office on Jun. 25, 2008, the entire contents of which are hereby incorporated by reference.

What is claimed is:

1. A semiconductor device comprising:
    a semiconductor region;
    a first electrode;
    a second electrode;
    a third electrode electrically connected to the first electrode;
    a fourth electrode electrically connected to the second electrode;
    a fifth electrode electrically connected to the third electrode;
    a sixth electrode electrically connected to the fourth electrode; and
    a functional circuit,
    wherein the sixth electrode is provided over the semiconductor region,
    wherein the semiconductor region comprises:
        a first impurity region comprising one of an n-type impurity and a p-type impurity;
        a resistance region provided at an inner periphery portion of the first impurity region in a plane view; and
        a second impurity region comprising the other of the n-type impurity and the p-type impurity and provided at an inner periphery portion of the resistance region in the plane view,
    wherein the first impurity region is electrically connected to the first electrode,
    wherein the second impurity region is electrically connected to the second electrode,
    wherein a first terminal of the functional circuit is electrically connected to the first electrode, and
    wherein a second terminal of the functional circuit is electrically connected to the second electrode.

2. The semiconductor device according to claim 1, wherein the functional circuit comprises a photoelectric conversion element and an amplifier circuit.

3. The semiconductor device according to claim 1,
    wherein a plurality of connection portions of the functional circuit and the first electrode is provided,
    wherein a plurality of connection portions of the functional circuit and the second electrode is provided,
    wherein the plurality of connection portions of the functional circuit and the first electrode has a uniform resistance value, and
    wherein the plurality of connection portions of the functional circuit and the second electrode has a uniform resistance value.

4. The semiconductor device according to claim 3, wherein the functional circuit comprises a photoelectric conversion element and an amplifier circuit.

5. The semiconductor device according to claim 1,
    wherein a plurality of connection portions of the first impurity region and the first electrode is provided, wherein a plurality of connection portions of the second impurity region and the second electrode is provided, wherein the plurality of connection portions of the first impurity region and the first electrode has a uniform resistance value, and wherein the plurality of connection portions of the second impurity region and the second electrode has a uniform resistance value.

6. The semiconductor device according to claim 1, wherein a resistance value of the resistance region is higher than resistance values of the first impurity region and the second impurity region.

7. A semiconductor device comprising:
a substrate;
a semiconductor region formed over the substrate;
a first electrode;
a second electrode;
a third electrode electrically connected to the first electrode;
a fourth electrode electrically connected to the second electrode;
a fifth electrode electrically connected to the third electrode;
a sixth electrode electrically connected to the fourth electrode; and
a functional circuit,
wherein the sixth electrode is provided over the semiconductor region,
wherein the semiconductor region comprises:
    a first impurity region comprising one of an n-type impurity and a p-type impurity;
    a resistance region provided at an inner periphery portion of the first impurity region in a plane view; and
    a second impurity region comprising the other of the n-type impurity and the p-type impurity and provided at an inner periphery portion of the resistance region in the plane view,
wherein the first impurity region is electrically connected to the first electrode,
wherein the second impurity region is electrically connected to the second electrode,
wherein a first terminal of the functional circuit is electrically connected to the first electrode, and
wherein a second terminal of the functional circuit is electrically connected to the second electrode.

8. The semiconductor device according to claim 7, wherein the functional circuit comprises a photoelectric conversion element and an amplifier circuit.

9. The semiconductor device according to claim 7,
wherein a plurality of connection portions of the functional circuit and the first electrode is provided,
wherein a plurality of connection portions of the functional circuit and the second electrode is provided,
wherein the plurality of connection portions of the functional circuit and the first electrode has a uniform resistance value, and
wherein the plurality of connection portions of the functional circuit and the second electrode has a uniform resistance value.

10. The semiconductor device according to claim 9, wherein the functional circuit comprises a photoelectric conversion element and an amplifier circuit.

11. The semiconductor device according to claim 7,
wherein a plurality of connection portions of the first impurity region and the first electrode is provided,
wherein a plurality of connection portions of the second impurity region and the second electrode is provided, wherein the plurality of connection portions of the first impurity region and the first electrode has a uniform resistance value, and wherein the plurality of connection portions of the second impurity region and the second electrode has a uniform resistance value.

12. The semiconductor device according to claim 7, wherein a resistance value of the resistance region is higher than resistance values of the first impurity region and the second impurity region.

13. A semiconductor device comprising:
a first semiconductor region;
a second semiconductor region;
a first electrode;
a second electrode;
a third electrode;
a fourth electrode;
a fifth electrode electrically connected to the second electrode and the third electrode;
a sixth electrode electrically connected to the first electrode and the fourth electrode;
a seventh electrode electrically connected to the fifth electrode; and
a eighth electrode electrically connected to the sixth electrode,
a functional circuit,
wherein the seventh electrode is provided over the first semiconductor region,
wherein the eighth electrode is provided over the second semiconductor region,
wherein the first semiconductor region comprises:
    a first n-type impurity region in contact with the first electrode;
    a first resistance region provided at an inner periphery portion of the first n-type impurity region in a plane view; and
    a first p-type impurity region provided at an inner periphery portion of the first resistance region in the plane view and in contact with the second electrode, and
wherein the second semiconductor region comprises:
    a second p-type impurity region in contact with the third electrode;
    a second resistance region provided at an inner periphery portion of the second p-type impurity region in the plane view; and
    a second n-type impurity region provided at an inner periphery portion of the second resistance region in the plane view and in contact with the fourth electrode,
wherein the seventh electrode overlaps with the first n-type impurity region, the first resistance region, and the first p-type impurity region,
wherein the eighth electrode overlaps with the second n-type impurity region, the second resistance region, and the second p-type impurity region,
wherein a first terminal of the functional circuit is electrically connected to the first electrode, and
wherein a second terminal of the functional circuit is electrically connected to the second electrode.

14. The semiconductor device according to claim 13, wherein the functional circuit comprises a photoelectric conversion element and an amplifier circuit.

15. The semiconductor device according to claim 13,
wherein a plurality of connection portions of the first n-type impurity region and the first electrode is provided, wherein a plurality of connection portions of the second n-type impurity region and the fourth electrode is provided, wherein the plurality of connection portions of the first n-type impurity region and the first electrode has a uniform resistance value, and wherein the plurality of connection portions of the second n-type impurity region and the fourth electrode has a uniform resistance value.

16. The semiconductor device according to claim 13, wherein a plurality of connection portions of the first p-type impurity region and the second electrode is provided, wherein a plurality of connection portions of the second p-type impurity region and the third electrode is provided, wherein the plurality of connection portions of the first p-type impurity region and the second electrode has a uniform resistance value, and wherein the plurality of connection portions of the second p-type impurity region and the third electrode has a uniform resistance value.

17. The semiconductor device according to claim 13, wherein a resistance value of the first resistance region is higher than resistance values of the first n-type impurity region and the first p-type impurity region, and wherein a resistance value of the second resistance region is higher than resistance values of the second n-type impurity region and the second p-type impurity region.

18. The semiconductor device according to claim 1, wherein the first impurity region is a square ring shape.

19. The semiconductor device according to claim 7, wherein the first impurity region is a square ring shape.

20. The semiconductor device according to claim 13, wherein the first n-type impurity region is a square ring shape, and wherein the second p-type impurity region is a square ring shape.

* * * * *